(12) United States Patent
Su et al.

(10) Patent No.: US 12,197,669 B2
(45) Date of Patent: Jan. 14, 2025

(54) ARRAY SUBSTRATE AND TOUCH DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Qiujie Su, Beijing (CN); Yanping Liao, Beijing (CN); Yingmeng Miao, Beijing (CN); Chongyang Zhao, Beijing (CN); Bo Hu, Beijing (CN); Xiaofeng Yin, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/489,747

(22) Filed: Oct. 18, 2023

(65) Prior Publication Data
US 2024/0061521 A1    Feb. 22, 2024

Related U.S. Application Data

(63) Continuation of application No. 17/310,984, filed as application No. PCT/CN2020/132801 on Nov. 30, 2020, now Pat. No. 11,829,540.

(51) Int. Cl.
*G06F 3/041* (2006.01)
*G02F 1/1333* (2006.01)
(Continued)

(52) U.S. Cl.
CPC ........ *G06F 3/0412* (2013.01); *G02F 1/13338* (2013.01); *G02F 1/134309* (2013.01);
(Continued)

(58) Field of Classification Search
CPC ............................ G06F 3/0446; G06F 3/0412
See application file for complete search history.

(56) References Cited

U.S. PATENT DOCUMENTS

| 9,024,913 B1 | 5/2015 | Jung et al. |
| 2006/0097991 A1 | 5/2006 | Hotelling et al. |
| (Continued) | | |

FOREIGN PATENT DOCUMENTS

| CN | 102402090 A | 4/2012 |
| CN | 105093758 A | 11/2015 |
| (Continued) | | |

OTHER PUBLICATIONS

Zuk, S. et al., "Capacitive touch sensor," Microelectronics International, vol. 35, No. 3, May 2018, 9 pages.
(Continued)

*Primary Examiner* — Kevin M Nguyen
(74) *Attorney, Agent, or Firm* — McCoy Russell LLP

(57) ABSTRACT

An array substrate and a touch display device are provided. In the array substrate, a first control unit and a second control unit are arranged opposite to each other in a first direction. A plurality of touch sensor blocks includes a first group of electrode blocks and a second group of electrode blocks arranged in the first direction, and a plurality of touch signal lines includes a first group of touch signal lines and a second group of touch signal lines arranged in the first direction. The touch signal lines in the first group of touch signal lines are coupled to the touch sensor blocks in the first group of electrode blocks respectively; and the touch signal lines in the second group of touch signal lines are coupled to the touch sensor blocks in the second group of electrode blocks respectively.

20 Claims, 26 Drawing Sheets

(51) Int. Cl.
*G02F 1/1343* (2006.01)
*G02F 1/1362* (2006.01)
*H01L 27/12* (2006.01)
*G06F 3/044* (2006.01)

(52) U.S. Cl.
CPC .. *G02F 1/136204* (2013.01); *G02F 1/136286* (2013.01); *H01L 27/124* (2013.01); *G06F 3/044* (2013.01)

(56) References Cited

U.S. PATENT DOCUMENTS

| | | | |
|---|---|---|---|
| 2016/0188040 | A1 | 6/2016 | Shin et al. |
| 2016/0209965 | A1 | 7/2016 | Kim et al. |
| 2017/0090636 | A1 | 3/2017 | Ding et al. |
| 2018/0129329 | A1 | 5/2018 | Liu et al. |
| 2020/0089369 | A1* | 3/2020 | Bang .................... G06F 3/0416 |
| 2020/0174609 | A1 | 6/2020 | Yoo et al. |
| 2020/0381485 | A1 | 12/2020 | Cai |

FOREIGN PATENT DOCUMENTS

| | | |
|---|---|---|
| CN | 105759482 A | 7/2016 |
| CN | 106406612 A | 2/2017 |
| CN | 107807756 A | 3/2018 |
| CN | 108062188 A | 5/2018 |
| CN | 110308815 A | 10/2019 |
| CN | 110456584 A | 11/2019 |
| CN | 111176487 A | 5/2020 |
| CN | 211293912 U | 8/2020 |
| JP | 2019061360 A | 4/2019 |

OTHER PUBLICATIONS

United States Patent and Trademark Office, Non-Final Office Action Issued in U.S. Appl. No. 17/310,984, filed Apr. 28, 2023, 13 pages.
European Patent Office, Extended European Search Report Issued in Application No. 20963039.1, Jul. 25, 2023, Germany, 12 pages.
United States Patent and Trademark Office, Notice of Allowance Issued in U.S. Appl. No. 17/310,984, filed Aug. 2, 2023, 8 pages.
ISA China National Intellectual Property Administration, International Search Report and Written Opinion Issued in Application No. PCT/CN2020/132801, Sep. 1, 2021, WIPO, 18 pages. (Submitted with Partial English Translation).

* cited by examiner

ARRAY SUBSTRATE AND TOUCH DISPLAY DEVICE

CROSS REFERENCE TO RELATED APPLICATIONS

This application is a continuation of U.S. Non-Provisional patent application Ser. No. 17/310,984, entitled "ARRAY SUBSTRATE AND TOUCH DISPLAY DEVICE", and filed on Sep. 2, 2021, which is the U.S. National Phase of PCT Application No. PCT/CN2020/132801 filed on Nov. 30, 2020, the entire contents of which are incorporated herein by reference.

TECHNICAL FIELD

The present disclosure relates to the field of display technology, in particular to an array substrate and a touch display device.

BACKGROUND

Touch panel can be seen everywhere due to such advantages as being slim and portable and being capable of providing man-machine interaction in a better manner. In various touch panels, a capacitive touch panel has been widely used due to such advantages as high sensitivity and being capable of achieving multi-point touch.

An operating principle of the capacitive touch panel is described as follows. A conductive material is arranged at a surface of a substrate to form a touch electrode. When the touch panel is touched by an object (e.g., a user's finger), a capacitance of the touch electrode at a touch point changes, and then a position of the touch point on the touch panel may be detected in accordance with the change in the capacitance.

A capacitive touch technology may include a mutual-capacitance-based touch technology and a self-capacitance-based touch technology.

For an add-in touch panel, the touch electrode is arranged between an array substrate and an opposite substrate of a display panel. The add-in touch panel has a wide application prospect due to such advantages as high integration level and being lighter and thinner.

SUMMARY

An object of the present disclosure is to provide an array substrate and a touch display device.

In order to achieve the above object, the technical solutions of the present disclosure will be described as follows.

In one aspect, the present disclosure provides in some embodiments an array substrate, including:
a base;
a first control unit and a second control unit arranged opposite to each other in a first direction;
a plurality of touch sensor blocks arranged independent of each other and arranged on the base in an array form, wherein the plurality of touch sensor blocks includes a first group of electrode blocks and a second group of electrode blocks, and a first group of electrode blocks and a second group of electrode blocks are arranged in the first direction; and
a plurality of touch signal lines arranged independent of each other, wherein at least a portion of each of the touch signal lines extends in the first direction, the plurality of touch signal lines includes a first group of touch signal lines and a second group of touch signal lines, and the first group of touch signal lines and the second group of touch signal lines are arranged in the first direction,
wherein the first group of touch signal lines includes a plurality of touch signal lines arranged in a second direction crossing the first direction, the touch signal lines in the first group of touch signal lines are coupled to touch sensor blocks in the first group of electrode blocks respectively, and one end of each of the touch signal lines in the first group of touch signal lines is coupled to the first control unit; and
the second group of touch signal lines includes a plurality of touch signal lines arranged in the second direction, the touch signal lines in the second group of touch signal lines are coupled to touch sensor blocks in the second group of electrode blocks respectively, and one end of each of the touch signal lines in the second group of touch signal lines is coupled to the second control unit.

In a possible embodiment of the present disclosure, two touch signal lines opposite to each other in the first direction are spaced apart from each other by an electrostatic protection distance in the first direction.

In a possible embodiment of the present disclosure, the array substrate further includes a plurality of pixel electrodes, and the electrostatic protection distance L1 meets $L1=k*H$, where H represents a maximum length of the pixel electrode in the first direction, and $2\% \leq k \leq 6\%$.

In a possible embodiment of the present disclosure, the electrostatic protection distance is greater than or equal to 10 μm.

In a possible embodiment of the present disclosure, each of at least a part of the touch signal lines includes a plurality of linear portions and a plurality of curved portions arranged alternately;
an orthogonal projection of at least a part of the curved portions of one touch signal line onto the base overlaps an orthogonal projection of a pixel electrode onto the base.

In a possible embodiment of the present disclosure, the first group of touch signal lines includes at least one first target touch signal line, an end of the at least one first target touch signal line proximate to the second group of touch signal lines is provided with a first target curved portion, the second group of touch signal lines includes at least one second target touch signal line, an end of the at least one second target touch signal line proximate to the first group of touch signal lines is provided with a second target curved portion, and the first target curved portion is spaced apart from the second target curved portion by a first protection distance greater than or equal to the electrostatic protection distance.

In a possible embodiment of the present disclosure, an orthogonal projection of the first target curved portion onto the base at least partially overlaps the orthogonal projection of the subpixel electrode onto the base, and the first target curved portion includes an extension portion extending in a direction away from the second group of touch signal lines.

In a possible embodiment of the present disclosure, the first group of touch signal lines include at least one third target touch signal line, an end of the at least one third target touch signal line proximate to the second group of touch signal lines is provided with a first target linear portion, the second group of touch signal lines includes at least one fourth target touch signal line, an end of the at least one fourth target touch signal line proximate to the first group of touch signal lines is provided with a second target linear portion, and the first target linear portion is spaced apart from the second target linear portion by a second protection distance greater than or equal to the electrostatic protection distance.

In a possible embodiment of the present disclosure, the array substrate further includes:
- a plurality of data lines, wherein at least a portion of the data line extends in the first direction;
- a plurality of switching elements each arranged between a curved portion and a data line that are adjacent to each other.

In a possible embodiment of the present disclosure, the quantity of touch sensor blocks in the first group of electrode blocks is equal to the quantity of touch sensor blocks in the second group of electrode blocks, and the quantity of touch signal lines in the first group of touch signal lines is equal to the quantity of touch signal lines in the second group of touch signal lines.

In a possible embodiment of the present disclosure, the array substrate further includes a plurality of data lines, wherein at least a portion of the data line extends in the first direction;
- each of the touch sensor blocks includes a plurality of touch electrodes electrically connected to each other and spaced apart from each other; and
- at least one of the first group of touch signal lines and the second group of touch signal lines includes a plurality of touch signal line sub-groups, each of the touch signal line sub-groups include two touch signal lines adjacent to each other in the second direction, orthogonal projections of the two adjacent touch signal lines onto the base are located at two sides of an orthogonal projection of a same data line onto the base respectively, and each of the orthogonal projections of the two adjacent touch signal lines and the orthogonal projection of the data line includes a portion arranged between orthogonal projections of two adjacent touch electrodes onto the base.

In a possible embodiment of the present disclosure, a layer where the two adjacent touch signal lines are located is different from a layer where the corresponding data line is located.

In a possible embodiment of the present disclosure, the array substrate further includes a plurality of gate lines, wherein at least a portion of the gate line extends in the second direction,
- wherein each of at least a part of the linear portions includes a first sub-portion and a second sub-portion coupled to each other, a width of the first sub-portion is greater than a width of the second sub-portion in a direction that is parallel to the base and perpendicular to an extension direction of the touch signal line, and an orthogonal projection of the first sub-portion onto the base covers an orthogonal projection of at least a portion of a side surface of the gate line onto the base; and/or
- each of at least a part of the curved portions includes a third sub-portion and a fourth sub-portion coupled to each other, a width of the third sub-portion is greater than a width of the fourth sub-portion in the direction that is parallel to the base and perpendicular to the extension direction of the touch signal line, and an orthogonal projection of the third sub-portion onto the base covers an orthogonal projection of at least a portion of a side surface of the gate line onto the base.

In a possible embodiment of the present disclosure, the gate line includes a plurality of gate patterns and a plurality of gate connection members, the gate patterns and the gate connection members are arranged alternately in the second direction, adjacent gate patterns are coupled to each other via the gate connection member, a width of the gate pattern is greater than a width of the gate connection member in the first direction;
- the orthogonal projection of the first sub-portion onto the base covers an orthogonal projection of at least a portion of a side surface of the gate connection member onto the base; and
- the orthogonal projection of the third sub-portion onto the base covers an orthogonal projection of at least a portion of a side surface of the gate pattern onto the base.

In a possible embodiment of the present disclosure, the first sub-portion extends in the first direction, and the gate connection member extends in a third direction angled related to the first direction at an angle smaller than 90°.

In a possible embodiment of the present disclosure, each of at least a part of the gate patterns includes a solid region and a first hollowed-out region, an orthogonal projection of the solid region onto the base at least partially overlaps the orthogonal projection of the third sub-portion onto the base, and an orthogonal projection of the first hollowed-out region onto the base at least partially overlaps an orthogonal protection of the fourth sub-portion onto the base.

In a possible embodiment of the present disclosure, each of the touch sensor blocks includes a plurality of touch electrodes that are electrically connected to each other and spaced apart from each other, the plurality of touch electrodes is arranged in an array form and includes touch electrodes arranged in rows in the first direction, and the touch electrodes in each row include a plurality of touch electrodes arranged in the second direction;
- each of the touch sensor blocks further includes:
  - a plurality of first common connection members corresponding to the rows of touch electrodes respectively, wherein each of the first common connection members is coupled to
  - the touch electrodes in a corresponding row;
  - a plurality of second common connection members, wherein two adjacent rows of touch electrodes are coupled to each other via at least one of the second common connection members.

In a possible embodiment of the present disclosure, the array substrate further includes a plurality of gate lines, wherein at least a portion of the gate line extends in the second direction, and the first common connection member is arranged in a same layer, and made of a same material, as the gate line.

In a possible embodiment of the present disclosure, the first common connection member is directly lapped onto a surface of the touch electrodes in a corresponding row.

In a possible embodiment of the present disclosure, a spacer region is provided between the first common connection members adjacent to each other in the second direction, and a width of the spacer region in the second direction is greater than or equal to 5 μm.

In a possible embodiment of the present disclosure, the array substrate further includes a plurality of data lines, wherein at least a portion of the data line extends in the first direction;
- an end of at least one of the two first common connection members adjacent to each other in the second direction is proximate to the spacer region, an orthogonal projection of the end of at least one of the two first common connection members onto the base overlaps an orthogonal projection of the data line onto the base at a first overlapping region, and a width of the first overlapping region is equal to a width of the data line in the second direction.

In a possible embodiment of the present disclosure, the array substrate further includes a plurality of data lines, wherein at least a portion of the data line extends in the first direction, and the second common connection member is arranged in a same layer, and made of a same material, as the data line.

In a possible embodiment of the present disclosure, the first common connection member is arranged at a first side of the touch electrodes in a corresponding row in the first direction;
   at least a portion of the second common connection member extends in the first direction, a first end of the second common connection member is coupled to the first common connection member coupled to the touch electrodes in one of the two adjacent rows, and a second end of the second common connection member is coupled to at least one of the touch electrodes in the other of the two adjacent rows.

In a possible embodiment of the present disclosure, the array substrate further includes a plurality of gate lines, wherein at least a portion of the gate line extends in the second direction, each of at least a part of the gate lines is provided with a second hollowed-out region, and an orthogonal projection of the second common connection member onto the base overlaps an orthogonal projection of the second hollowed-out region onto the base.

In a possible embodiment of the present disclosure, each of the touch sensor blocks includes a plurality of touch electrodes that are electrically connected to each other and spaced apart from each other, and the array substrate further includes:
   a plurality of gate lines, wherein at least a portion of the gate line extends in the second direction; and
   a plurality of third common connection members, wherein at least one of the third common connection members is arranged between the touch sensor blocks adjacent to each other in the first direction, at least a portion of the third common connection member extends in the first direction, a first end of the third common connection member is coupled to the touch electrodes in a first touch sensor block of two adjacent touch sensor blocks, a second end of the third common connection member is not coupled to a second touch sensor block of the adjacent touch sensor blocks, an orthogonal portion of at least a portion of the third common connection member onto the base overlaps an orthogonal projection of the gate line onto the base at a second overlapping region;
   an orthogonal projection of at least a portion of the second common connection member onto the base overlaps the orthogonal projection of the gate line onto the base at a third overlapping region, and a width of the second overlapping region is equal to a width of the third overlapping region in the first direction.

In a possible embodiment of the present disclosure, each of at least a part of the gate lines is provided with a third hollowed-out region, and an orthogonal projection of the third common connection member onto the base at least partially overlaps an orthogonal projection of the third hollowed-out region onto the base.

In a possible embodiment of the present disclosure, an orthogonal projection of the second end of the third common connection member onto the base does not overlap the orthogonal projection of the gate line onto the base.

In a possible embodiment of the present disclosure, the orthogonal projection of the second end of the third common connection member onto the base does not overlap an orthogonal projection of the first common connection member included in a second one of the adjacent touch sensor blocks onto the base.

In another aspect, the present disclosure provides in some embodiments a touch display device including the above-mentioned array substrate.

In a possible embodiment of the present disclosure, the touch display device further includes an opposite substrate and a liquid crystal layer, the opposite substrate is arranged opposite to the array substrate, and the liquid crystal layer is arranged between the opposite substrate and the array substrate.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

The array substrate and the touch display device of the present disclosure will be described hereinafter in details in conjunction with the embodiments and drawings.

As compared with such touch panels as an add-on touch panel, an add-in touch panel is advantageous in terms of cost and stability. For the add-in touch panel, a touch electrode is arranged inside the panel, so the design of pixels is highly demanded. Usually, for a small-or-medium-size panel applied in the field of TPC and MNT, each touch sensor block has a size of 4 mm to 6 mm. Taking a 10-inch TPC product as an example, the quantity of touch sensor blocks in the entire panel is about 1500, and taking a 23.8-inch MNT product as an example, the quantity of touch sensor blocks in the entire panel is about 3600. For a TV or IWB product, the quantity of touch sensor blocks is in a range from ten thousands to several tens of thousands.

Figure 1:
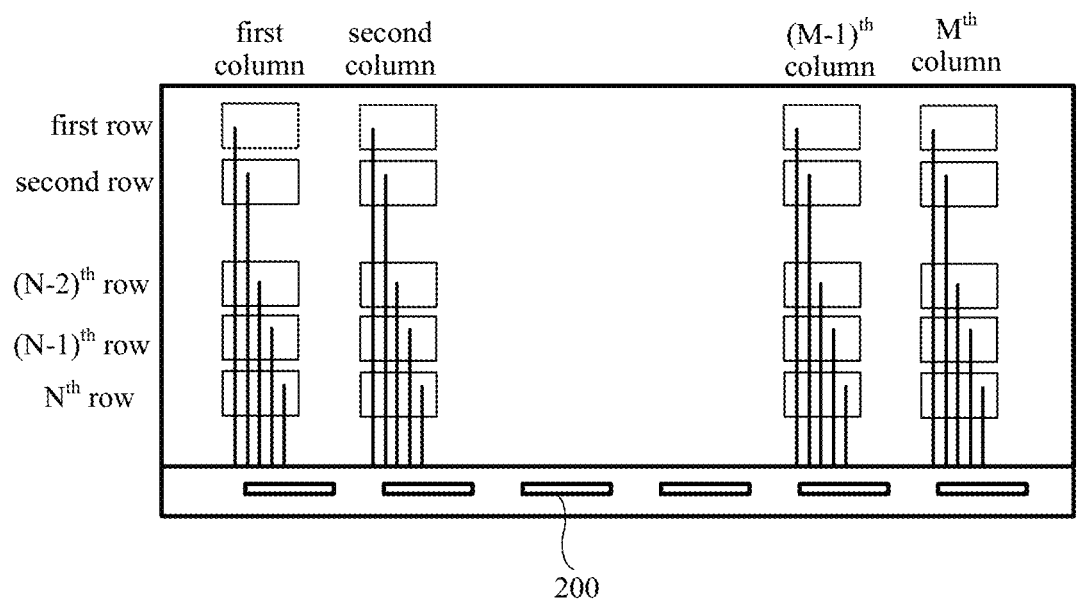
FIG. 1 is a schematic view showing an array substrate in related art.

As shown in FIG. 1, the more the touch sensor blocks in the panel, the more the touch signal lines to be provided. However, there is a limited space in the panel, and when a large quantity of touch signal lines is provided, the difficulty in the arrangement of the touch signal lines and the connection between each touch signal line and a touch Integrated Circuit (IC) 200 increases remarkably.

Figure 2:
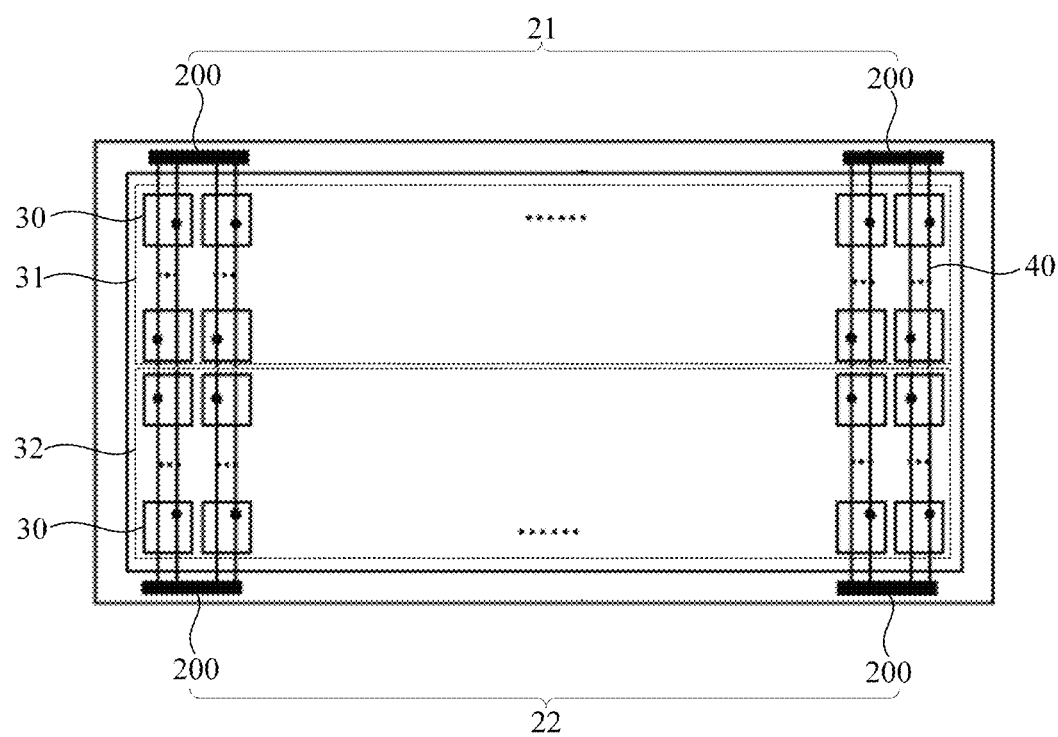
FIG. 2 is a first schematic view showing an array substrate according to an embodiment of the present disclosure.
Figure 3:
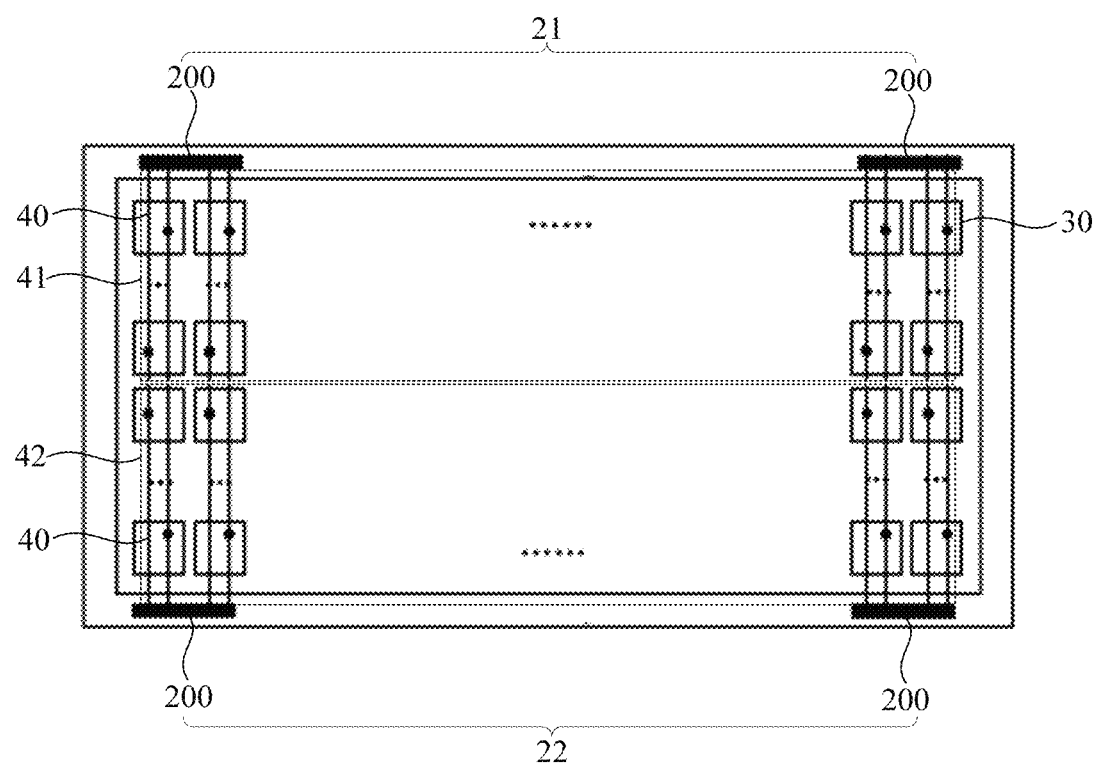
FIG. 3 is a second schematic view showing the array substrate according to an embodiment of the present disclosure.
Figure 4:
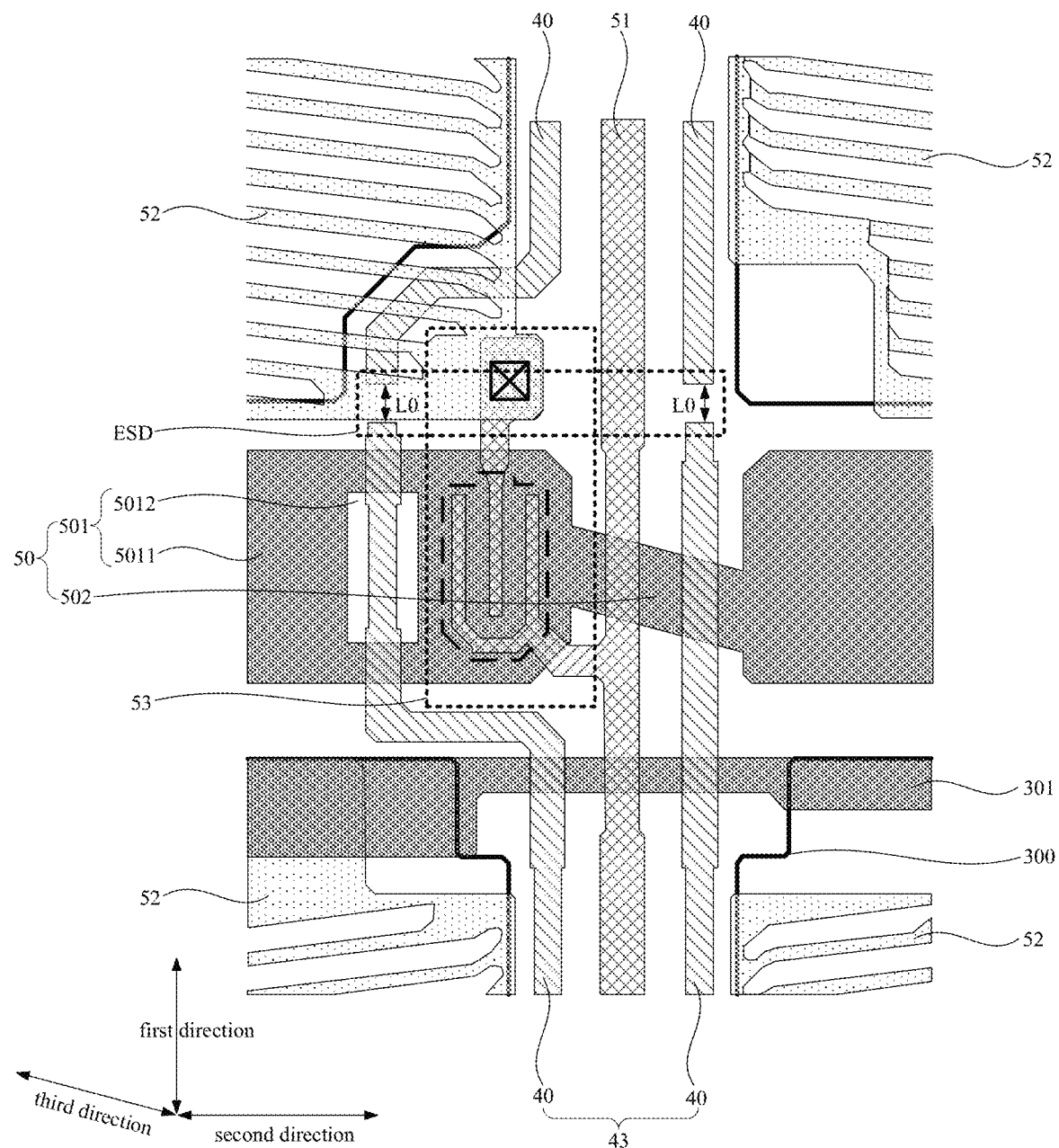
FIG. 4 is a first schematic view showing a partial structure of the array substrate near a central region according to an embodiment of the present disclosure.

As shown in FIGS. 2-4, the present disclosure provides in some embodiments an array substrate, which includes a base, a first control unit 21, a second control unit 22, a plurality of touch sensor blocks 30 and a plurality of touch signal lines 40.

The first control unit 21 is arranged opposite to the second control unit 22 in a first direction.

The plurality of touch sensor blocks 30 is arranged independent of each other, and arranged in an array form on the base. The plurality of touch sensor blocks 30 includes a first group of electrode blocks 31 and a second group of electrode blocks 32 arranged in the first direction.

The plurality of touch signal lines 40 is arranged independent of each other, and at least a portion of each touch signal line 40 extends in the first direction. The plurality of touch signal lines 40 includes a first group of touch signal lines 41 and a second group of touch signal lines 42 arranged in the first direction.

The plurality of touch signal lines 40 in the first group of touch signal lines 41 is arranged in a second direction crossing the first direction. The plurality of touch signal lines 40 in the first group of touch signal lines 41 is coupled to the plurality of touch sensor blocks 30 in the first group of electrode blocks 31 respectively, and an end of each touch signal line 40 in the first group of touch signal lines 41 is coupled to the first control unit 21.

The plurality of touch signal lines 40 in the second group of touch signal lines 42 is arranged in the second direction. The plurality of touch signal lines 40 in the second group of touch signal lines 42 is coupled to the plurality of touch sensor blocks 30 in the second group of electrode blocks 32 respectively, and an end of each touch signal line 40 in the second group of touch signal lines 42 is coupled to the second control unit 22.

For example, the first control unit 21 includes at least one touch IC 200, and the second control unit 22 includes at least one touch IC 200.

For example, each touch IC 200 is configured to provide a touch signal, a common electrode signal, etc.

For example, each touch IC 200 is bound to the base.

For example, each touch IC 200 is coupled to the base through a Chip On Film (COF) technology.

For example, the plurality of touch sensor blocks 30 is arranged in an array form on the base, and spaced apart from each other.

For example, the plurality of touch sensor blocks 30 includes the first group of electrode blocks 31 and the second group of electrode blocks 32. The first group of electrode blocks 31 includes a plurality of touch sensor blocks 30 arranged in an array form, and the second group of electrode blocks 32 includes a plurality of touch sensor blocks 30 arranged in an array form.

For example, the quantity of touch sensor blocks 30 in the first group of electrode blocks 31 is equal to the quantity of touch sensor blocks 30 in the second group of electrode blocks 32.

For example, the touch sensor blocks 30 in the first group of electrode blocks 31 are arranged in a same mode as the touch sensor blocks 30 in the second group of electrode blocks 32.

For example, the first group of electrode blocks 31 is arranged symmetrical with the second group of electrode blocks 32.

For example, the plurality of touch signal lines 40 includes the first group of touch signal lines 41 and the second group of touch signal lines 42 arranged in the first direction.

For example, the quantity of touch signal lines 40 in the first group of touch signal lines 41 is equal to the quantity of touch signal lines 42 in the second group of touch signal lines 42.

For example, the plurality of touch signal lines 40 in the first group of touch signal lines has an approximately same length in the first direction, and the plurality of touch signal lines 40 in the second group of touch signal lines has an approximately same length in the first direction.

For example, the plurality of touch signal lines 40 in the first group of touch signal lines 41 is arranged in the second direction, and the plurality of touch signal lines 40 in the second group of touch signal lines 42 is arranged in the second direction.

For example, the first direction includes a vertical direction, and the second direction includes a horizontal direction.

For example, the plurality of touch signal lines 40 in the first group of touch signal lines 41 corresponds to the plurality of touch sensor blocks 30 in the first group of electrode blocks 31 respectively, and each touch signal line 40 in the first group of touch signal lines 41 is coupled to a corresponding touch sensor block 30.

For example, the plurality of touch signal lines 40 in the first group of touch signal lines 41 corresponds to a plurality of touch pins of the first control unit 21 respectively, and an end of each touch signal line 40 in the first group of touch signal lines 41 is coupled to a corresponding touch pin.

For example, the plurality of touch signal lines 40 in the second group of touch signal lines 42 corresponds to the plurality of touch sensor blocks 30 in the second group of electrode blocks 32 respectively, and each touch signal line 40 in the second group of touch signal lines 42 is coupled to a corresponding touch sensor block 30.

For example, the plurality of touch signal lines 40 in the second group of touch signal lines 42 corresponds to a plurality of touch pins of the second control unit 22 respectively, and an end of each touch signal line 40 in the second group of touch signal lines 42 is coupled to a corresponding touch pin.

Each touch sensor block 30 is coupled to the control unit via a corresponding touch signal line 40, and the control unit is coupled to a touch Micro Control Unit (MCU), so as to enable the touch MCU to determine coordinates of a touch point for the subsequent operation.

For example, the plurality of touch signal lines 40 in the first group of touch signal lines 41 corresponds to the plurality of touch signal lines 40 in the second group of touch signal lines 42 respectively, and each touch signal line 40 in the first group of touch signal lines 41 is arranged opposite to a respective touch signal line 40 in the second group of touch signal lines 42 in the first direction.

For example, ends of the touch signal lines 40 in the first group of touch signal lines 41 away from the first control unit 21 are flush with each other.

For example, ends of the touch signal lines 40 in the second group of touch signal lines 42 away from the second control unit 22 are flush with each other.

It should be appreciated that, each black dot in FIGS. 2, 3, 5 and 6 represents a via-hole for electrical connection, and each touch signal line 40 is electrically connected to the corresponding touch sensor block 30 through at least one via-hole. For example, the touch signal line 40 is electrically connected to at least one first common connection member in the corresponding touch sensor block 30 through the via-hole. For example, the touch signal line 40 is electrically connected to at least one touch electrode 300 in the corresponding touch sensor block 30 through the via-hole.

Based on the above-mentioned specific structure, in the array substrate according to the embodiments of the present disclosure, the first control unit 21 and the second control unit 22 are arranged opposite to each other in the first direction, and the plurality of touch sensor blocks 30 includes the first group of electrode blocks 31 and the second group of electrode blocks 32. In addition, the first group of touch signal lines 41 and the second group of touch signal lines 42 are arranged, so that the first group of touch signal lines 41 is coupled to the first group of electrode blocks 31 and the first control unit 21, and the first control unit 21 writes a signal into the first group of electrode blocks 31 or receives a signal fed back from the first group of electrode blocks 31 via the first group of touch signal lines 41. In addition, the second group of touch signal lines 42 is coupled to the second group of electrode blocks 32 and the second control unit 22, and the second control unit 22 writes a signal into the second group of electrode blocks 32 or receives a signal fed back from the second group of electrode blocks 32 via the second group of touch signal lines 42.

According to the embodiments of the present disclosure, the entire array substrate is divided into two parts arranged in the first direction and capable of being used to control a touch operation separately. During the arrangement of the touch signal lines 40, it is able to increase the quantity of touch signal lines with an active connection effect. In addition, it is unnecessary for each touch signal line 40 to extend across the entire array substrate in the first direction, and instead, it is merely necessary for it to extend across a region where a corresponding group of electrode blocks is located. In this way, it is able to reduce a space desired for the arrangement of the touch signal lines 40 in the array substrate, thereby to remarkably reduce the difficulty in the arrangement of the touch signal lines 40 in a large-size array substrate. In addition, it is able to improve an aperture ratio of each subpixel in the array substrate during the arrangement of the touch signal line 40.

In addition, based on the above-mentioned arrangement mode, the touch signal lines 40 in the entire array substrate are divided into two groups, and each group of touch signal lines 40 is coupled to a corresponding control unit. In this way, it is able to drive the array substrate from two sides, thereby to effectively reduce the difficulty in the connection between the touch signal line 40 and the control unit.

Figure 12:
FIG. 12 is a schematic view showing the layout of touch sensor blocks according to an embodiment of the present disclosure.

As shown in FIG. 12, in some embodiments of the present disclosure, each touch sensor block 30 includes a plurality of touch electrodes 300 electrically connected to each other and spaced apart from each other;

As shown in FIG. 4, the array substrate further includes:
 a plurality of gate lines 50, at least a portion of each gate line 50 extending in the second direction;
 a plurality of data lines 51, at least a portion of each data line 51 extending in the first direction, the plurality of data lines 51 crossing the plurality of gate lines 50 to define a plurality of subpixel regions;
 a plurality of pixel electrodes 52 corresponding to the plurality of subpixel regions respectively, each pixel electrode 52 being located within a corresponding subpixel region.

For example, the plurality of touch electrodes 300 of each touch sensor block 30 is arranged in an array form, the adjacent touch electrodes 300 are spaced apart from each other, and the plurality of touch electrodes 300 of each touch sensor block 30 is electrically connected to each other.

For example, the touch electrode 300 is reused as a common electrode in the array substrate. When the array substrate is applied to a display device and an image is displayed by the display device normally, the touch electrode 300 serves as the common electrode; and when a touch function is achieved by the display device, a touch scanning operation is controlled by the control unit, and the touch electrode 300 serves as a touch sensor.

It should be appreciated that, each touch sensor block of the array substrate is not a complete electrode layer covering a part of continuous region of the array substrate, and instead, it consists of a plurality of common electrodes independent of each other. For example, the common electrodes correspond to subpixels in the array substrate respectively.

For example, the plurality of gate lines 50 is arranged in the first direction, and at least a portion of each gate line 50 extends in the second direction.

For example, the plurality of data lines 51 is arranged in the second direction, and at least a portion of each data line 51 extends in the first direction.

For example, the plurality of data lines 51 is arranged in such a manner as to cross the plurality of gate lines 50, so as to define the plurality of subpixel regions arranged in an array form.

For example, each pixel electrode 52 is made of a transparent conductive material, e.g., indium tin oxide (ITO).

For example, each pixel electrode 52 is configured to receive a data signal from the data line 51, and each subpixel is configured to achieve a display function under the control of a corresponding pixel electrode 52 and a corresponding common electrode.

For example, the array substrate further includes a plurality of switching elements 53 corresponding to the plurality of pixel electrodes 52 respectively. For example, the switching element 53 is a Thin Film Transistor (TFT) and includes a first electrode, a second electrode and a control electrode. The control electrode of the switching element 53 is a part of a corresponding gate line, and the second electrode of the switching element 53 is coupled to a corresponding pixel electrode 52.

For example, the plurality of switching elements 53 is arranged in an array form, i.e., arranged in rows in the first direction or arranged in columns in the second direction. The plurality of gate lines 50 correspond to the plurality of rows of switching elements 53 respectively. Each gate line 50 is coupled to control ends of the switching elements 53 in a corresponding row, and configured to control the switching elements 53 coupled thereto to be turned on or off.

There are various coupling modes between the data lines 51 and the switching elements 53 arranged in columns. For example, the plurality of data lines 51 corresponds to a plurality of columns of the switching elements 53 respectively. Each data line 51 is coupled to the first electrodes of the switching elements 53 in a corresponding column, and configured to write a data signal into the first electrodes of the switching elements 53. For example, the data line 51 is coupled to two columns of switching elements 53 adjacent to the data lines 51, i.e., the switching elements 53 coupled to the data lines 51 are arranged at two sides of the data line 51 alternately. Through this structure, during the driving, positive and negative signals are applied alternately by the data lines 51 arranged in a row in the first direction to the pixel electrodes 52 in a corresponding column.

It should be appreciated that, in the array substrate, because there is a relatively large quantity of touch sensor blocks 30 and each touch sensor block 30 needs to be connected to one touch signal line 40, the difficulty in the arrangement of the touch signal lines 40 and the connection between the touch signal lines 40 and the touch IC 200 is overcome through bonding PADs at two sides, i.e., through double-side driving.

Figure 5:
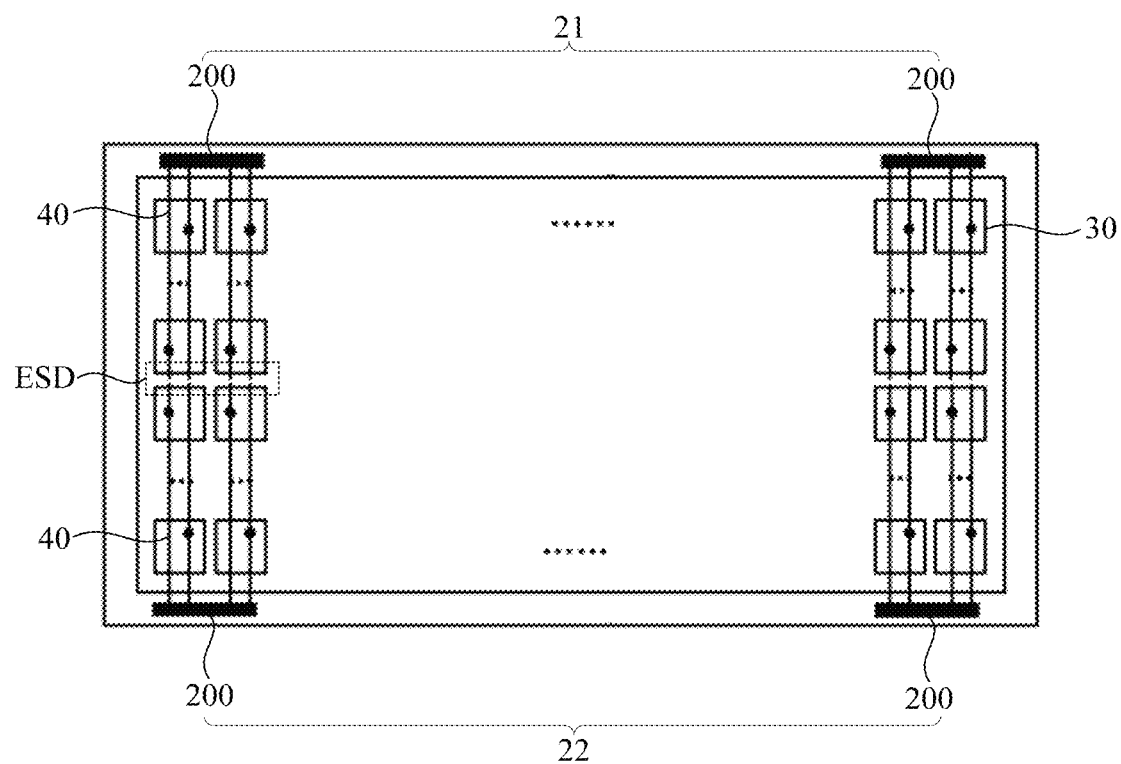
FIG. 5 is a third schematic view showing the array substrate according to an embodiment of the present disclosure.

As shown in FIGS. 4 and 5, when the array substrate with the above-mentioned structure is adopted and the touch sensor blocks 30 of a half of the array substrate are driven by the touch IC 200 on the PAD at a corresponding side, in order to provide a same load at each region of the array substrate, each of the first group of touch signal lines 41 and the second group of touch signal lines 42 extends to a central region of the array substrate, so that the two touch signal lines 40 opposite to each other in the first direction are spaced apart from each other by a sufficiently small distance to prevent the occurrence of short-circuit. For example, the distance L0 is greater than or equal to 4 μm. In addition, usually the touch signal line 40 is relatively thin, and it usually has a width of 4 μm to 10 μm.

It is found through experiments that, in the above-mentioned array substrate, the touch signal lines 40 for driving two parts of a display panel are arranged opposite to each other in the first direction, and two ends of two opposite touch signal lines 40 are arranged exactly opposite to each other at the central region, so an electrostatic discharge (ESD) phenomenon easily occurs at the central region. At this time, the touch signal lines 40 are burned out, and the short circuit occurs between the two opposite touch signal lines 40.

Figure 6:
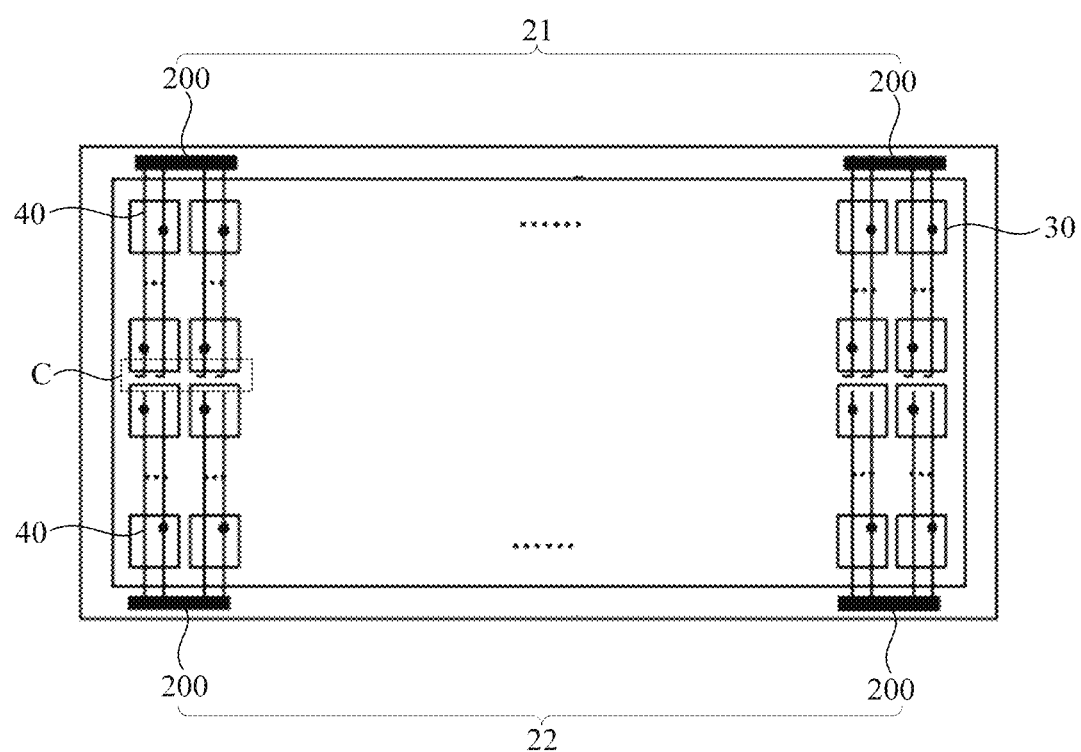
FIG. 6 is a fourth schematic view showing the array substrate according to an embodiment of the present disclosure.
Figure 7:
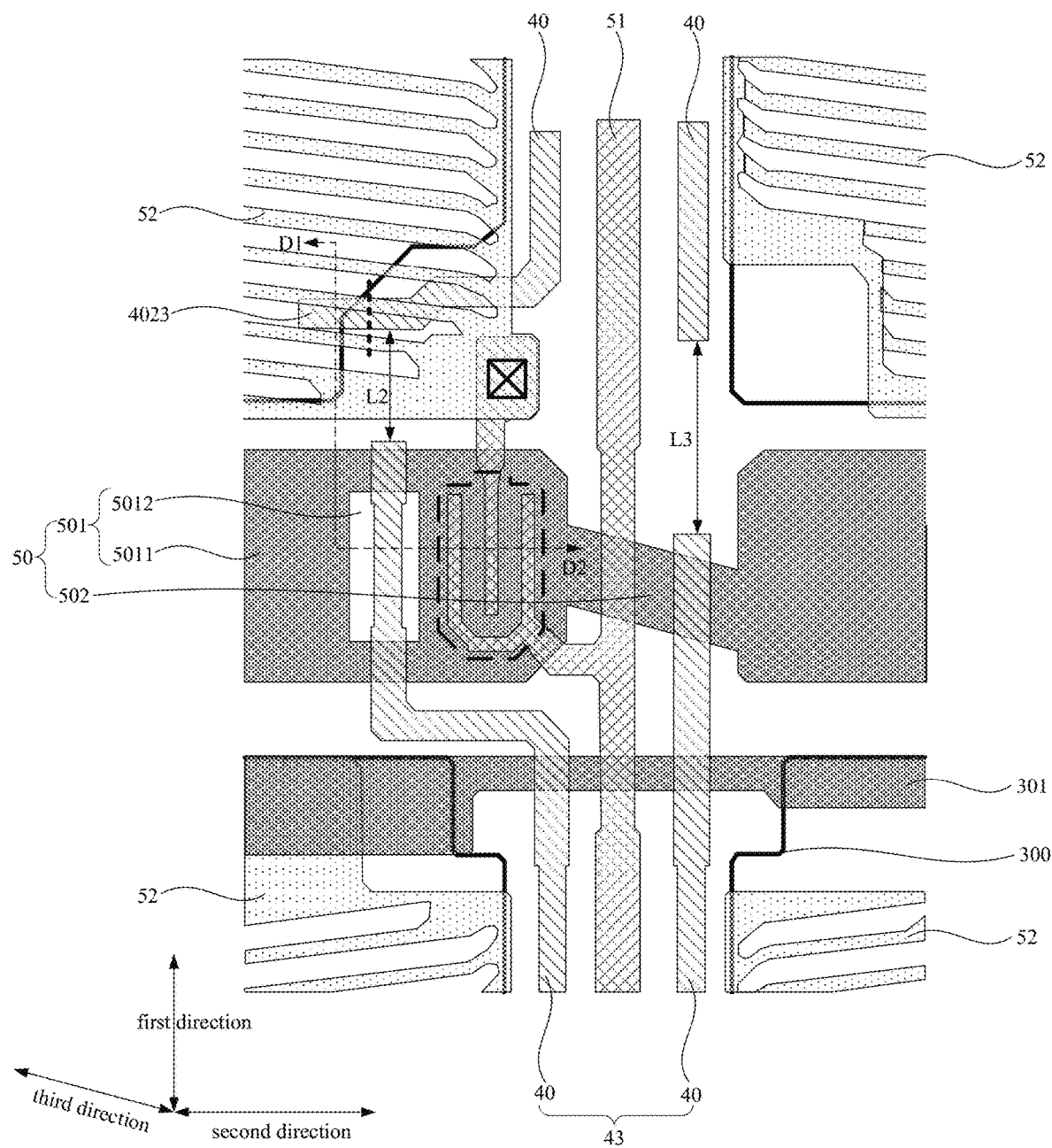
FIG. 7 is a second schematic view showing the partial structure of the array substrate near the central region according to an embodiment of the present disclosure.
Figure 8:
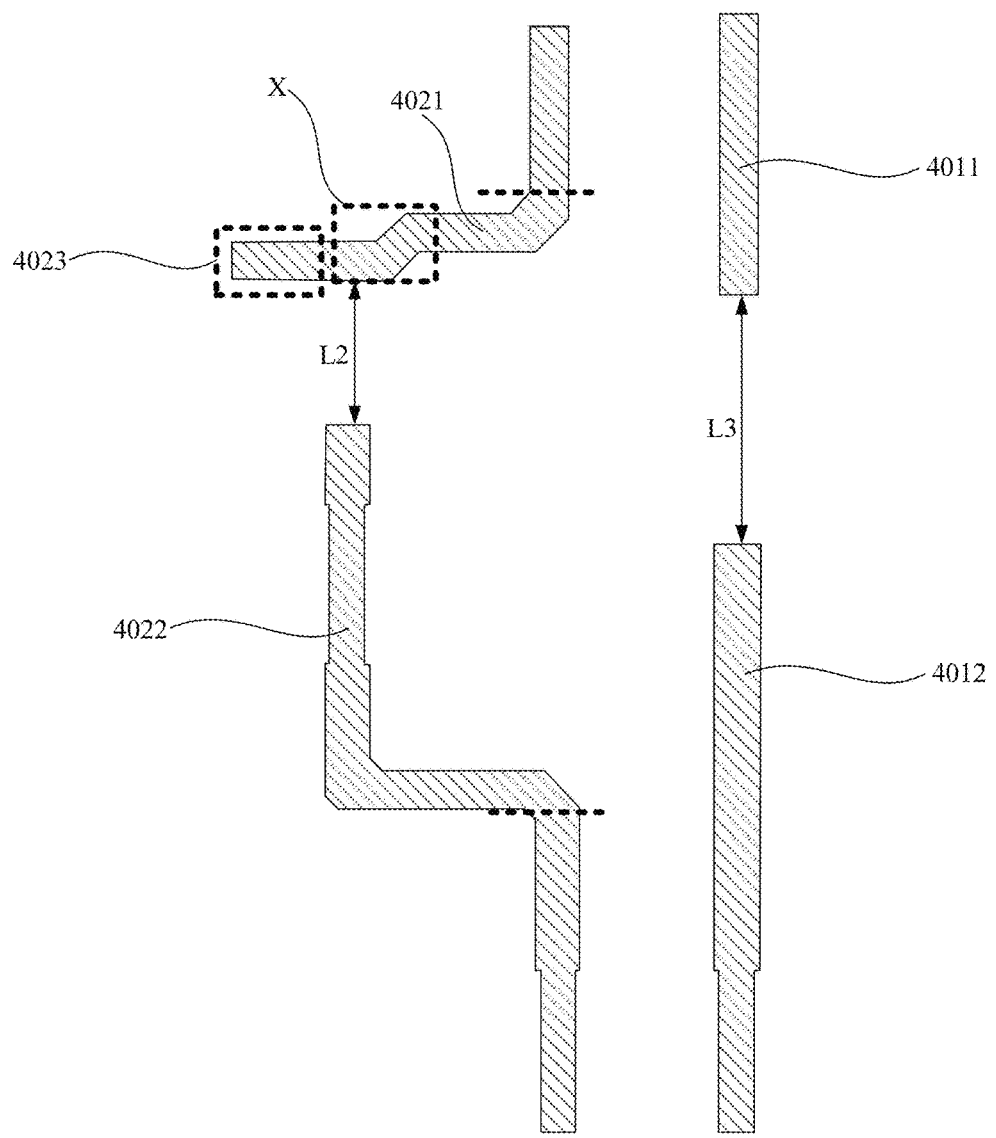
FIG. 8 is a schematic view showing touch signal lines in FIG. 7.

As shown in FIGS. 6 to 8, in some embodiments of the present disclosure, two touch signal lines 40 opposite to each other in the first direction are spaced apart from each other by an electrostatic protection distance in the first direction.

For example, in two touch signal lines 40 opposite to each other in the first direction, one of the touch signal lines 40 belongs to the first group of touch signal lines 41, and the other belongs to the second group of touch signal lines 42.

For example, the electrostatic protection distance is greater than or equal to 10 μm, e.g., greater than or equal to 20 μm. To be specific, the electrostatic protection distance is 10 μm, 12 μm, 15 μm, 18 μm, 20 μm or 22 μm.

Through the above-mentioned arrangement, it is able to increase the distance between the two touch signal lines 40 opposite to each other in the first direction, effectively prevent the occurrence of the ESD between the two touch signal lines 40 arranged opposite to each other in the first direction, and ensure display performance and touch performance when the array substrate is applied to a display device.

In some embodiments of the present disclosure, the array substrate further includes a plurality of pixel electrodes 52, and the electrostatic protection distance L1 meets $L1=k*H$, where H represents a maximum length of the pixel electrode 52 in the first direction, and $2\% \leq k \leq 6\%$.

The electrostatic protection distance is within a range of 2% H to 6% H, e.g., 2% H, 3% H, 4% H, 5% H or 6% H.

When the electrostatic protection distance meets the above-mentioned condition, it is able to increase the distance between the two touch signal lines 40 opposite to each other in the first direction, effectively prevent the occurrence of the ESD between the two touch signal lines 40 arranged opposite to each other in the first direction, and ensure display performance and touch performance when the array substrate is applied to the display device.

As shown in FIGS. 7-9 and 11, in some embodiments of the present disclosure, each of at least a part of the touch signal lines 40 includes a plurality of linear portions 401 and a plurality of curved portions 402 arranged alternately, and orthogonal projections of at least a part of the curved portions 402 of the touch signal line 40 onto the base 10 overlap an orthogonal projection of a corresponding pixel electrode 52 onto the base 10.

For example, the linear portions 401 and curved portions 402 of the same touch signal line 40 are formed integrally.

For example, the touch signal line 40 is arranged in a same layer, and made of a same material, as the data line 51.

For example, the touch signal line 40 is arranged in a layer different from the data line 51.

For example, the touch signal line 40 is made of a metal material.

For example, the linear portion 401 extends in the first direction.

For example, the linear portion 401 is arranged parallel to the data line 51.

For example, a distance between the orthogonal projection of the curved portion onto the base 10 and an orthogonal projection of an adjacent data line 51 onto the base 10 is greater than a distance between an orthogonal projection of each linear portion 401 onto the base 10 and the orthogonal projection of the adjacent data line 51 onto the base 10.

For example, the orthogonal projections of at least a part of the curved portions 402 of the same touch signal line 40 onto the base 10 overlap the orthogonal projection of the corresponding pixel electrode 52 onto the base 10.

For example, the orthogonal projection of each curved portion onto the base 10 does not overlap an orthogonal projection of the switching element 53 onto the base 10.

Through the above arrangement mode, it is able to reduce the difficulty in the arrangement of the touch signal lines 40, and reduce a parasitic capacitance generated between the touch signal line 40 and the other structure of the array substrate.

As shown in FIGS. 7 and 8, in some embodiments of the present disclosure, the first group of touch signal lines 41 includes at least one first target touch signal line, an end of the at least one first target touch signal line proximate to the second group of touch signal lines 42 is provided with a first target curved portion 4021, the second group of touch signal lines 42 includes at least one second target touch signal line, an end of the at least one second target touch signal line proximate to the first group of touch signal lines 41 is provided with a second target curved portion 4022, and the first target curved portion 4021 is spaced apart from the second target curved portion 4022 by a first protection distance L2 greater than or equal to the electrostatic protection di stance L1.

For example, the first group of touch signal lines 41 includes a plurality of first target touch signal lines, the second group of touch signal lines 42 includes a plurality of second target touch signal lines corresponding to the first target touch signal lines respectively, and each first target touch signal line is arranged opposite to a corresponding second target touch signal line in the first direction.

In each first target touch signal line and the corresponding second target touch signal line, an end of the first target touch signal line proximate to the second target touch signal line is provided with a first target curved portion 4021, an end of the second target touch signal line proximate to the first target touch signal line is provided with a second target curved portion 4022 arranged opposite to the first target curved portion 4021 in the first direction, and the first target curved portion 4021 is spaced apart from the second target curved portion 4022 by the first protection distance L2 in the first direction.

For example, a portion of the first target curved portion 4021 proximate to the second target curved portion 4022 is removed, so that the first target curved portion 4021 is spaced apart from the second target curved portion 4022 by the first protection distance L2.

Through the above-mentioned arrangement mode, it is able to increase the distance between the two touch signal lines 40 opposite to each other in the first direction, effectively prevent the occurrence of the ESD between the two touch signal lines 40 opposite to each other in the first direction, and ensure display performance and touch performance when the array substrate is applied to the display device.

It should be appreciated that, in the above-mentioned array substrate, the orthogonal projections of at least a part of the curved portions 402 of the touch signal line 40 onto the base 10 overlap the orthogonal projection of the corresponding pixel electrode 52 onto the base 10 to generate a small overlapping capacitor, and this overlapping capacitor is a part of a pixel storage capacitor Cst. In order to prevent the occurrence of the ESD, the distance between the two touch signal lines 40 arranged opposite to each other in the first direction is increased. When the distance increases, an overlapping capacitor generated at the pixel electrode 52 near the central region is located at a position different from the other capacitor, so a display defect easily occurs.

As shown in FIGS. 7 and 8, in some embodiments of the present disclosure, an orthogonal projection of the first target curved portion 4021 onto the base 10 at least partially overlaps the orthogonal projection of the pixel electrode 52 onto the base 10. The first target curved portion 4021 includes an extension portion 4023 extending in a direction away from the second group of touch signal lines 42 (i.e., away from the second target curved portion 4022).

For example, the extension portion 4032 and the first target curved portion 4021 are formed integrally.

For example, the extension portion 4023 extends in the second direction.

For example, an orthogonal projection of the extension portion 4023 onto the base 10 overlaps the orthogonal projection of the pixel electrode 52 onto the base 10.

It should be appreciated that, a size of the extension portion 4023 is set according to the practical need, as long as a size of Cst for a subpixel at the position is the same as a size of Cst for a subpixel at the other position.

Through the above-mentioned arrangement mode, it is able to compensate for an overlapping area between the first target curved portion 4021 and the pixel electrode 52 while ensuring the electrostatic protection distance L1 between the first target touch signal line and the second target touch signal line, and enable a size of Cst for a subpixel at the position to be the same as a size of Cst for a subpixel at the other position, thereby to reduce the risk of display abnormality.

In addition, when the extension portion 4023 extends in the direction away from the second group of touch signal lines 42, an end of the touch signal line (i.e., an end of the extension portion 4023) is located away from the second target curved portion 4022, so it is able to prevent the occurrence of the short circuit caused by electrostatic breakdown when the ends are arranged opposite to each other.

It should be appreciated that, as shown in FIG. 8, a portion of the first target curved portion 4021 in contact with the extension portion 4023 includes a curved portion X.

Through the curved portion X, the first target curved portion 4021 is arranged at a position away from the second electrode of the corresponding switching element 53, so as to prevent the occurrence of the short circuit between the first target curved portion 4021 and the second electrode of the switching element 53. In addition, it is able for the first target curved portion 4021 to be located closer to the corresponding gate line, thereby to improve the aperture ratio of the pixel in a better manner.

As shown in FIGS. 7 and 8, in some embodiments of the present disclosure, the first group of touch signal lines 41 includes at least one third target touch signal line, an end of the at least one third target touch signal line proximate to the second group of touch signal lines 42 is provided with a first target linear portion 4011, the second group of touch signal lines 42 includes at least one fourth target touch signal line, an end of the at least one fourth target touch signal line proximate to the first group of touch signal lines 41 is provided with a second target linear portion 4012, and the first target linear portion 4011 is spaced apart from the second target linear portion 4012 by a second protection distance L3 greater than or equal to the electrostatic protection distance L1.

For example, the first group of touch signal lines 41 includes a plurality of third target touch signal lines, the second group of touch signal lines 42 includes a plurality of fourth target touch signal lines corresponding to the third target touch signal lines respectively, and each third target touch signal line is arranged opposite to a corresponding fourth target touch signal line in the first direction.

In each third target touch signal line and the corresponding fourth target touch signal line, an end of the third target touch signal line proximate to the fourth target touch signal line is provided with a first target linear portion 4011, an end of the fourth target touch signal line proximate to the third target touch signal line is provided with a second target linear portion 4012 arranged opposite to the first target linear portion 4011 in the first direction, and the first target linear portion 4011 is spaced apart from the second target linear portion 4012 by the second protection distance L3 in the first direction.

Through the above-mentioned arrangement mode, it is able to increase the distance between the two touch signal lines 40 opposite to each other in the first direction, effectively prevent the occurrence of the ESD between the two touch signal lines 40 opposite to each other in the first direction, and ensure display performance and touch performance when the array substrate is applied to the display device.

In some embodiments of the present disclosure, the second protection distance L3 is greater than the first protection distance L2.

It should be appreciated that, the pixel storage capacitor Cst is not adversely affected by the first target linear portion 4011 and the second target linear portion 4012, and an end of the first target linear portion 4011 is arranged opposite to an end of the second target linear portion 4012 at the central region, so it is able to appropriately increase the second protection distance L3. For example, the second protection distance L3 is greater than 20 μm, so as to prevent the occurrence of the ESD between the first target linear portion 4011 and the second target linear portion 4012 at the central region in a better manner.

An end of the first target curved portion 4021 is not arranged opposite to an end of the second target curved portion 4022 at the central region, so the first protection distance L2 is provided with a smaller value, so as to reduce the risk of the ESD.

Figure 16:
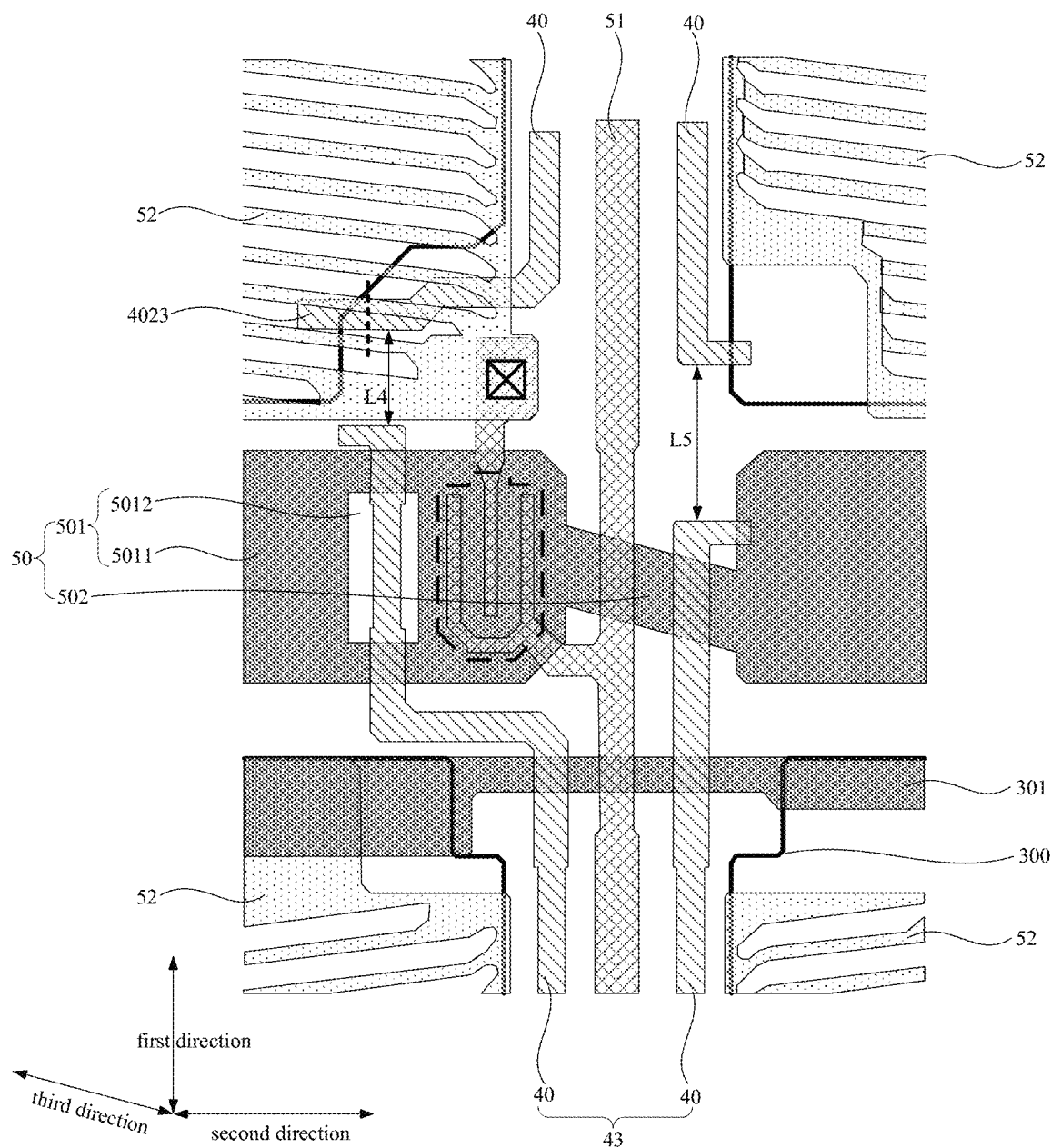
FIG. 16 is a third schematic view showing the partial structure of the array substrate near the central region according to an embodiment of the present disclosure.

As shown in FIG. 16, in some embodiments of the present disclosure, the first target curved portion 4021 includes an extension portion 4023, at least a portion of the second target curved portion 4022 extends in the second direction, at least a portion of the first target linear portion 4011 extends in the second direction, and at least a portion of the second target linear portion 4012 extends in the second direction.

Figure 17:
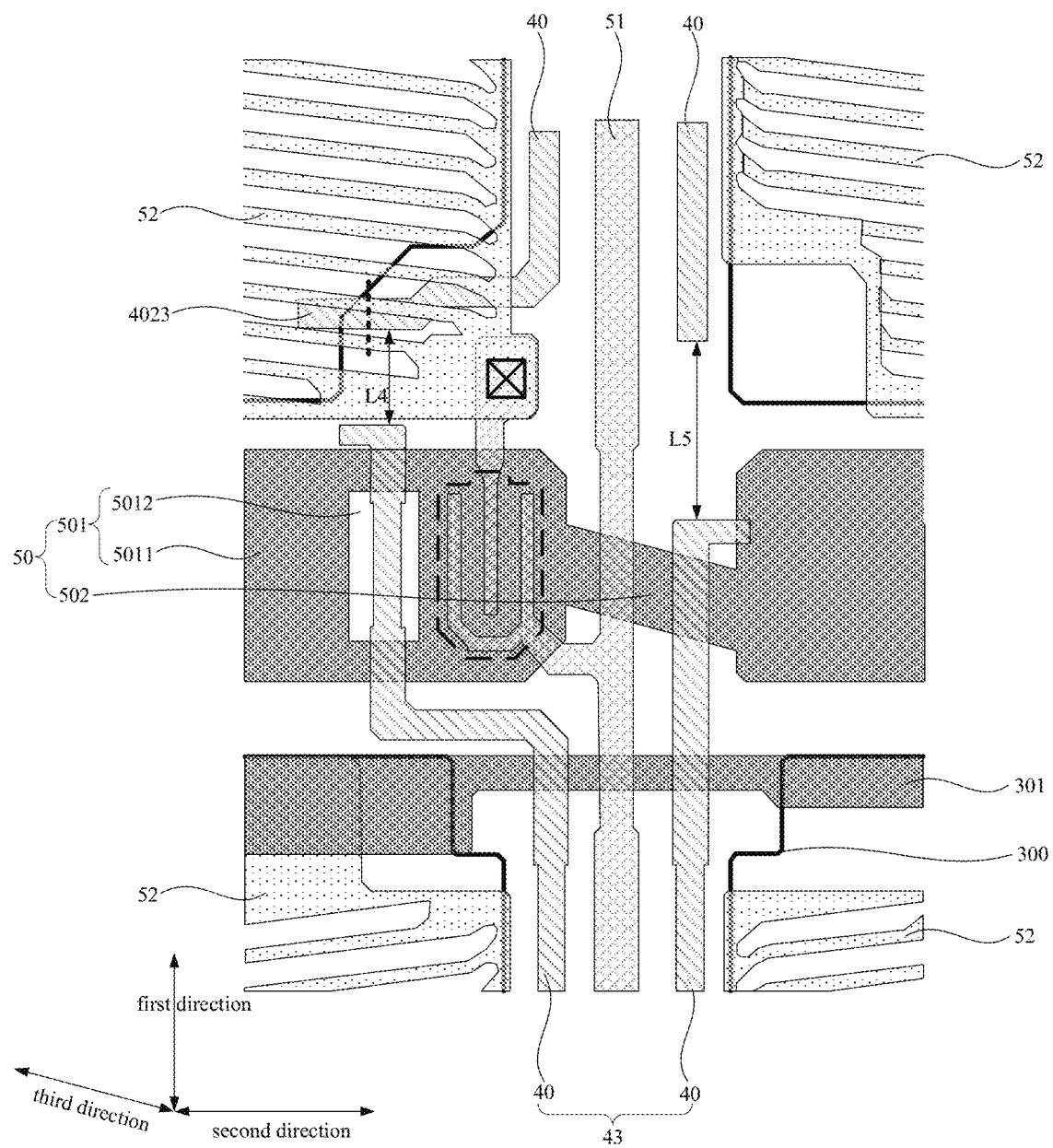
FIG. 17 is a fourth schematic view showing the partial structure of the array substrate near the central region according to an embodiment of the present disclosure.

As shown in FIG. 17, in some embodiments of the present disclosure, the first target curved portion 4021 includes an extension portion 4023, at least a portion of the second target curved portion 4022 extends in the second direction, at least a portion of the first target linear portion 4011 extends in the first direction, and at least a portion of the second target linear portion 4012 extends in the second direction.

Figure 18:
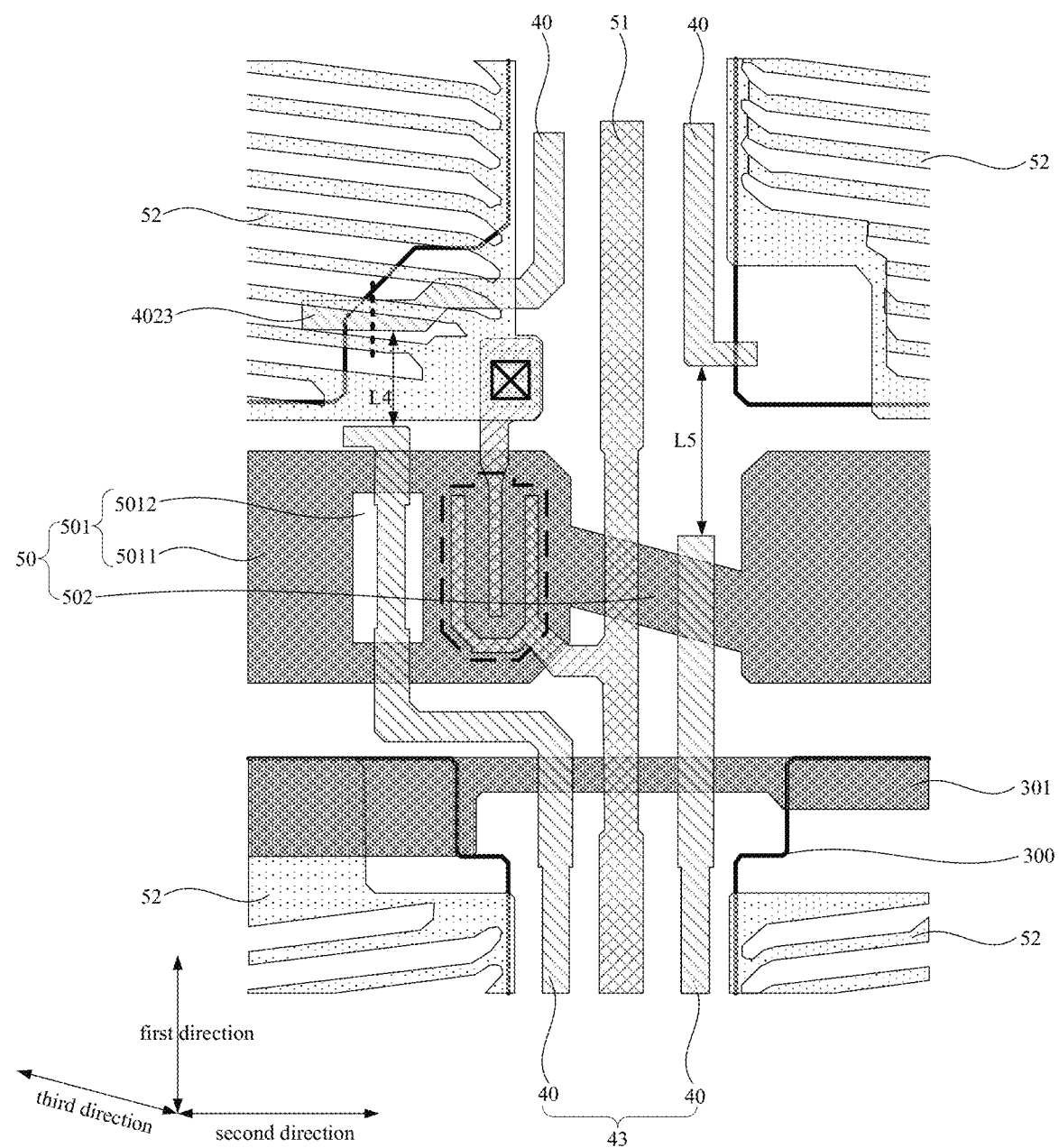
FIG. 18 is a fifth schematic view showing the partial structure of the array substrate near the central region according to an embodiment of the present disclosure.

As shown in FIG. 18, in some embodiments of the present disclosure, the first target curved portion 4021 includes an extension portion 4023, at least a portion of the second target curved portion 4022 extends in the second direction, at least a portion of the first target linear portion 4011 extends in the second direction, and at least a portion of the second target linear portion 4012 extends in the first direction.

Figure 19:
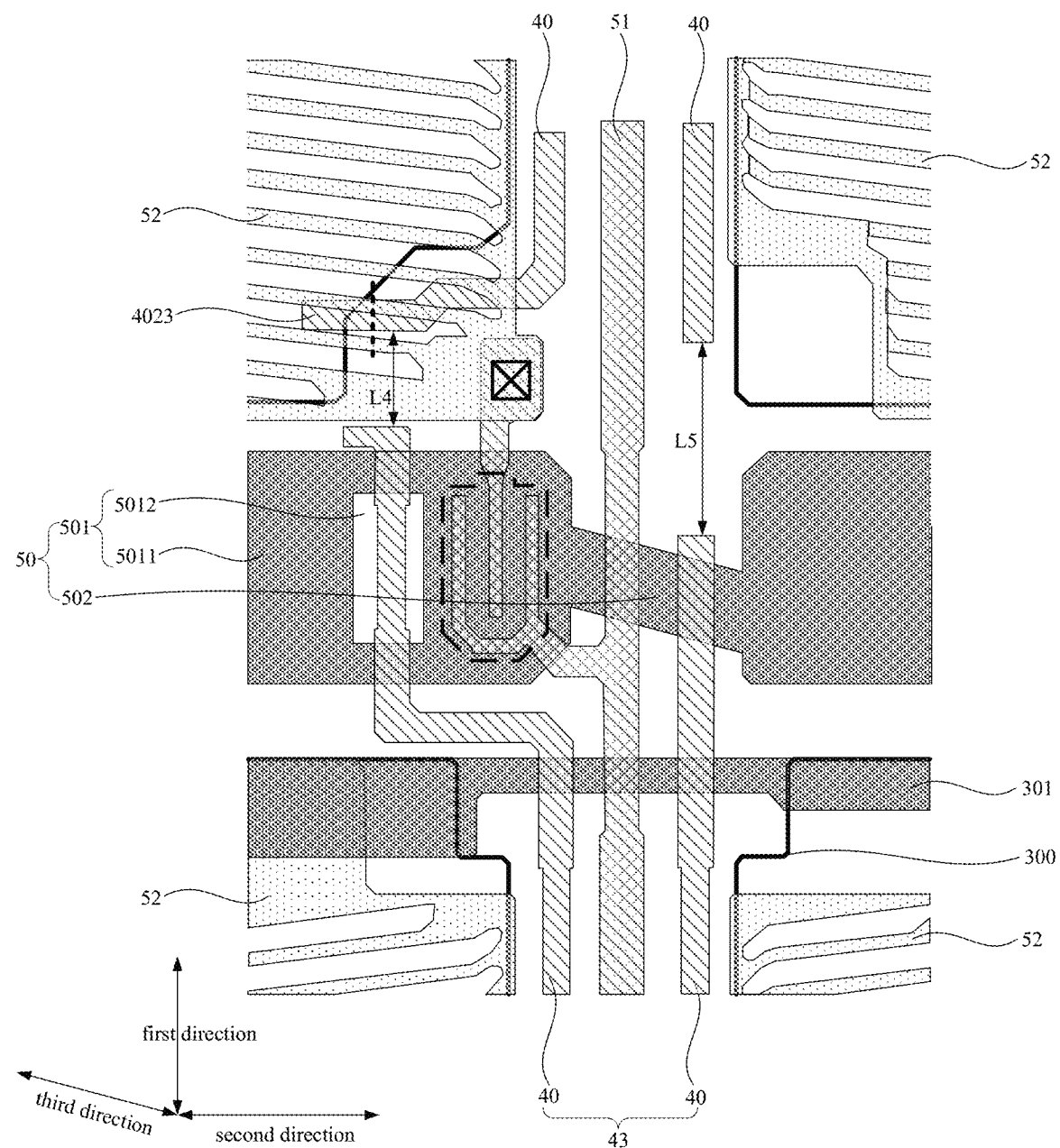
FIG. 19 is a sixth schematic view showing the partial structure of the array substrate near the central region according to an embodiment of the present disclosure.

As shown in FIG. 19, in some embodiments of the present disclosure, the first target curved portion 4021 includes an extension portion 4023, at least a portion of the second target curved portion 4022 extends in the second direction, at least a portion of the first target linear portion 4011 extends in the first direction, and at least a portion of the second target linear portion 4012 extends in the first direction.

Figure 20:
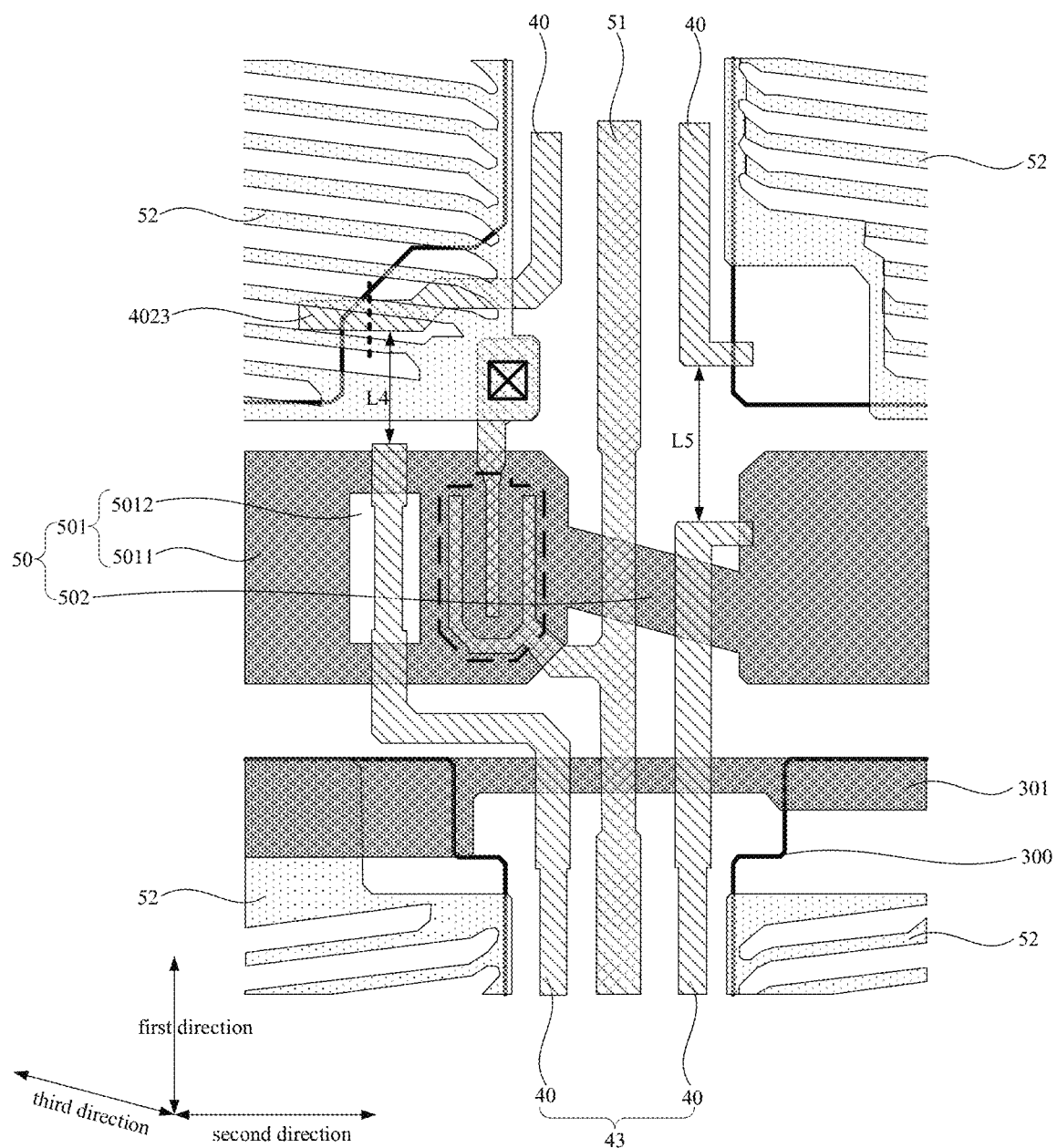
FIG. 20 is a seventh schematic view showing the partial structure of the array substrate near the central region according to an embodiment of the present disclosure.

As shown in FIG. 20, in some embodiments of the present disclosure, the first target curved portion 4021 includes an extension portion 4023, at least a portion of the second target curved portion 4022 extends in the first direction, at least a portion of the first target linear portion 4011 extends in the second direction, and at least a portion of the second target linear portion 4012 extends in the second direction.

Figure 21:
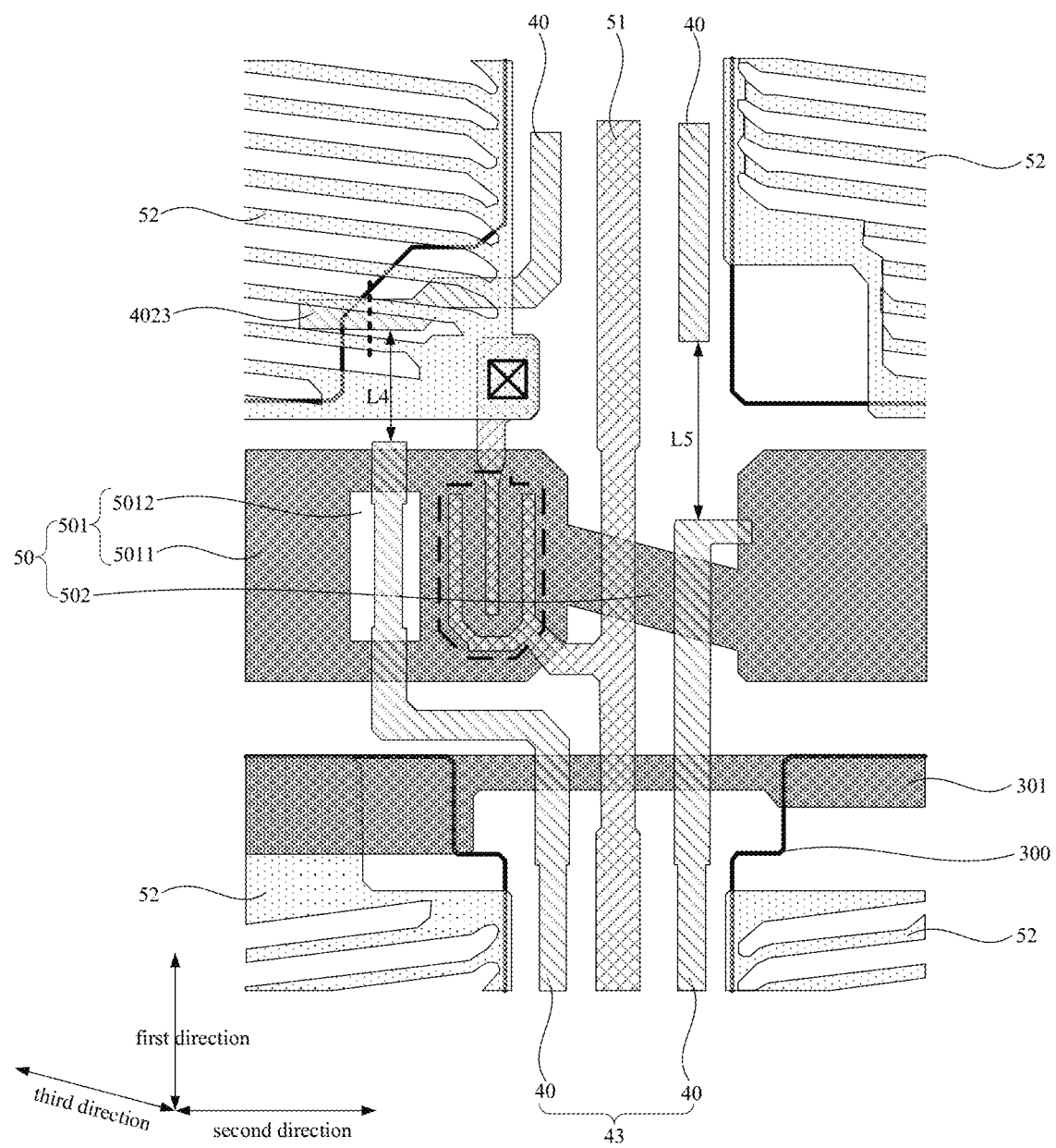
FIG. 21 is an eighth schematic view showing the partial structure of the array substrate near the central region according to an embodiment of the present disclosure.

As shown in FIG. 21, in some embodiments of the present disclosure, the first target curved portion 4021 includes an extension portion 4023, at least a portion of the second target curved portion 4022 extends in the first direction, at least a portion of the first target linear portion 4011 extends in the first direction, and at least a portion of the second target linear portion 4012 extends in the second direction.

Figure 22:
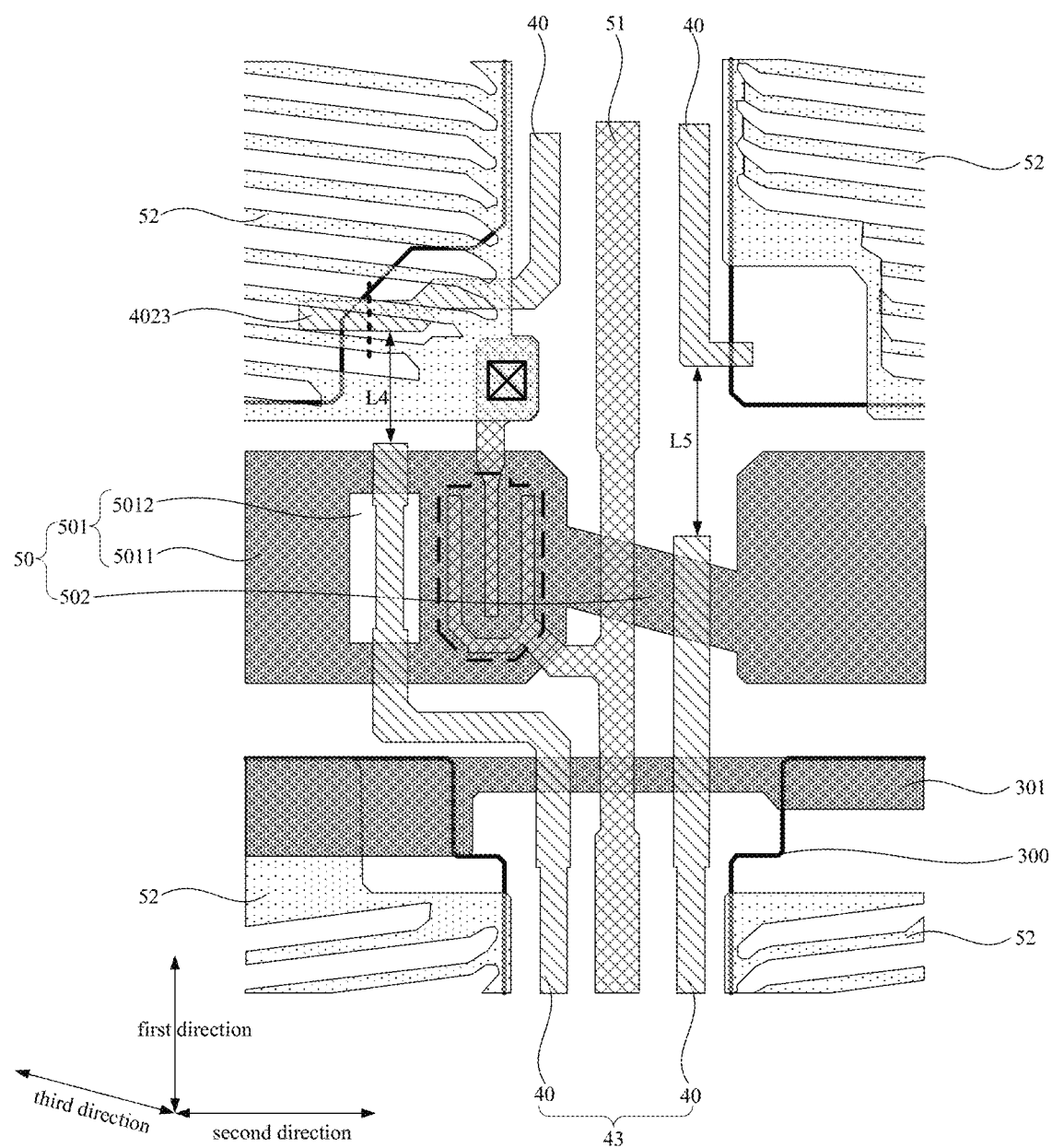
FIG. 22 is a ninth schematic view showing the partial structure of the array substrate near the central region according to an embodiment of the present disclosure.

As shown in FIG. 22, in some embodiments of the present disclosure, the first target curved portion 4021 includes an extension portion 4023, at least a portion of the second target curved portion 4022 extends in the first direction, at least a portion of the first target linear portion 4011 extends in the second direction, and at least a portion of the second target linear portion 4012 extends in the first direction.

It should be appreciated that, the above-mentioned array substrate includes an array substrate with an Advanced Switching (ADS) mode or an In-Plane Switching (IPS) mode.

As shown in FIGS. 23 to 30, in the array substrate with the IPS mode, the pixel electrodes 52 and common electrodes 70 in each subpixel form an interdigitated structure, and the common electrodes 70 in different subpixels are coupled to each other via a common electrode line 71. The pixel electrode 52 and the common electrode 70 are arranged in a same layer and made of a same metal material.

Figure 23:
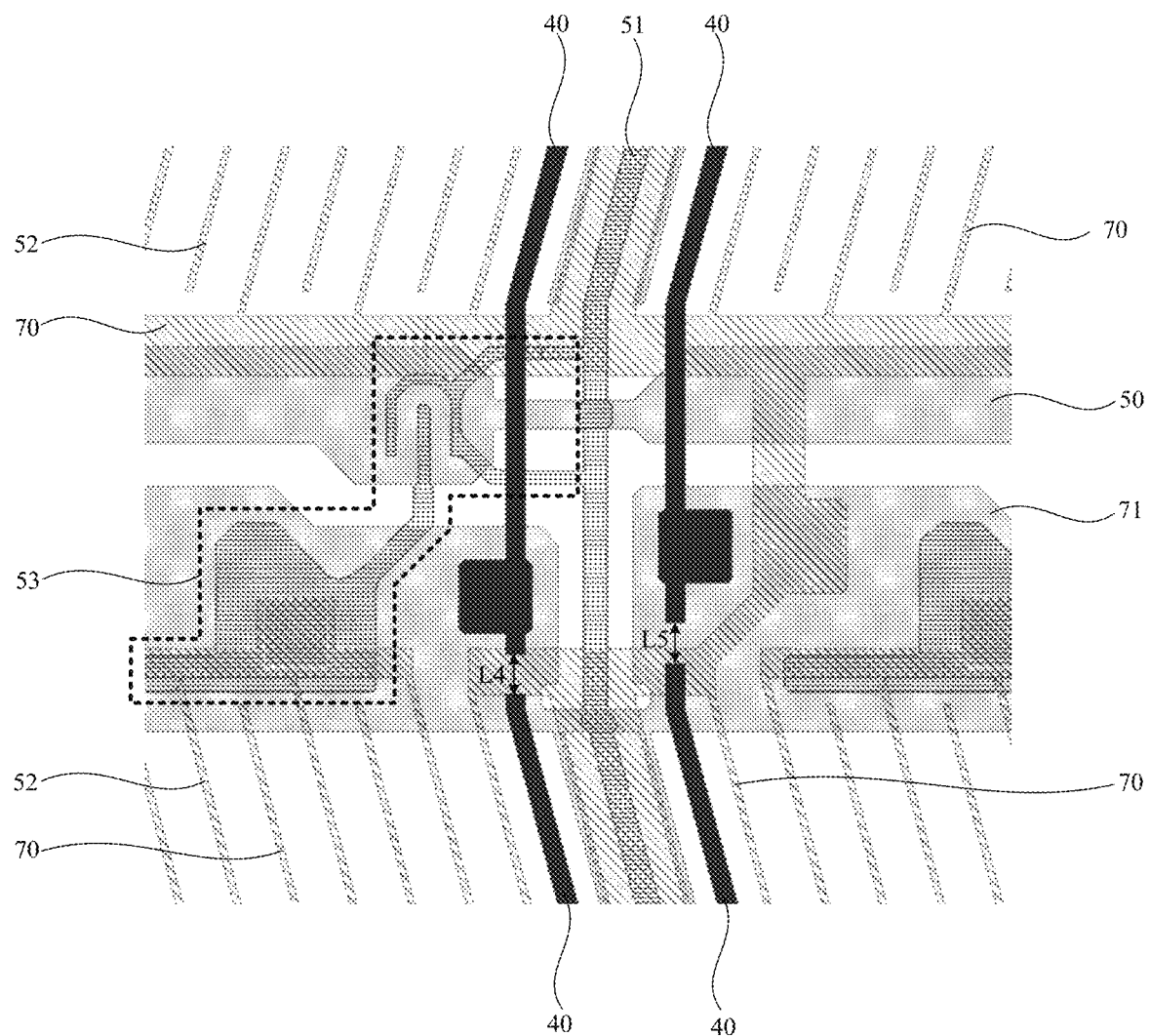
FIG. 23 is a tenth schematic view showing the partial structure of the array substrate near the central region according to an embodiment of the present disclosure.
Figure 24:
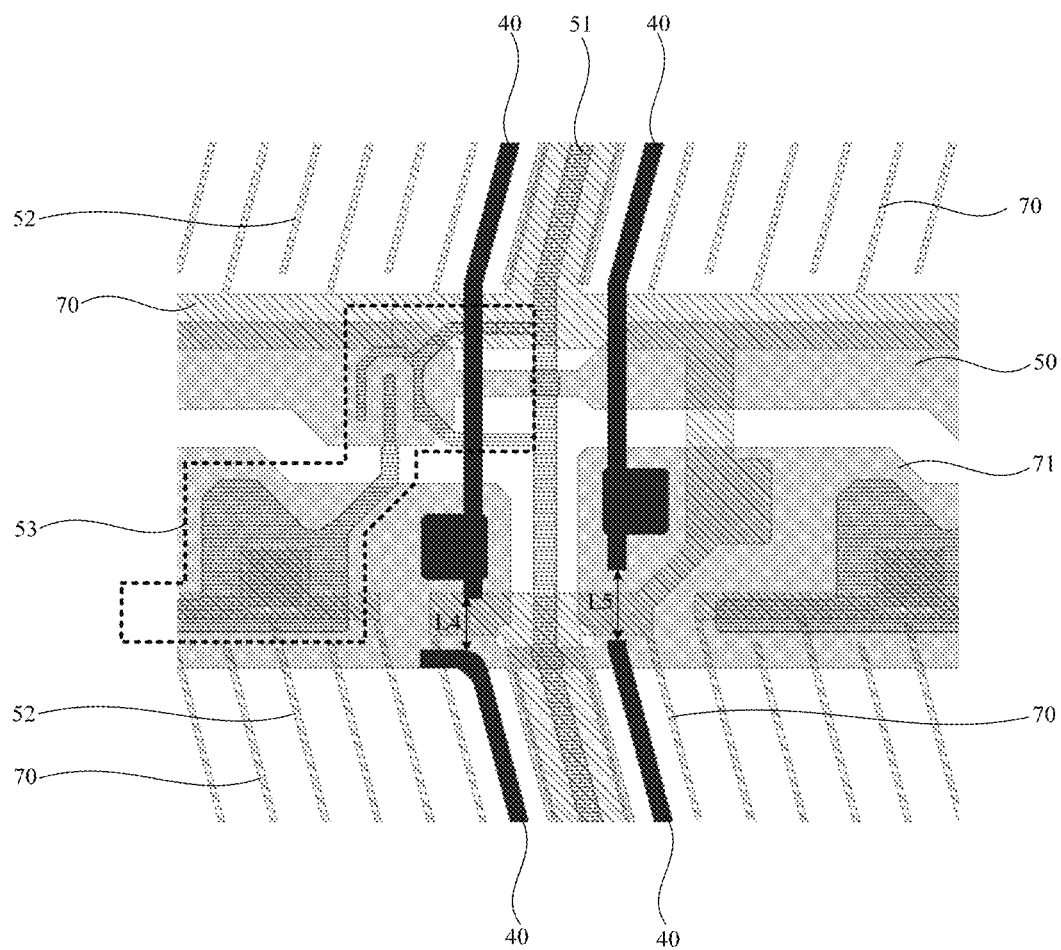
FIG. 24 is a eleventh schematic view showing the partial structure of the array substrate near the central region according to an embodiment of the present disclosure.
Figure 25:
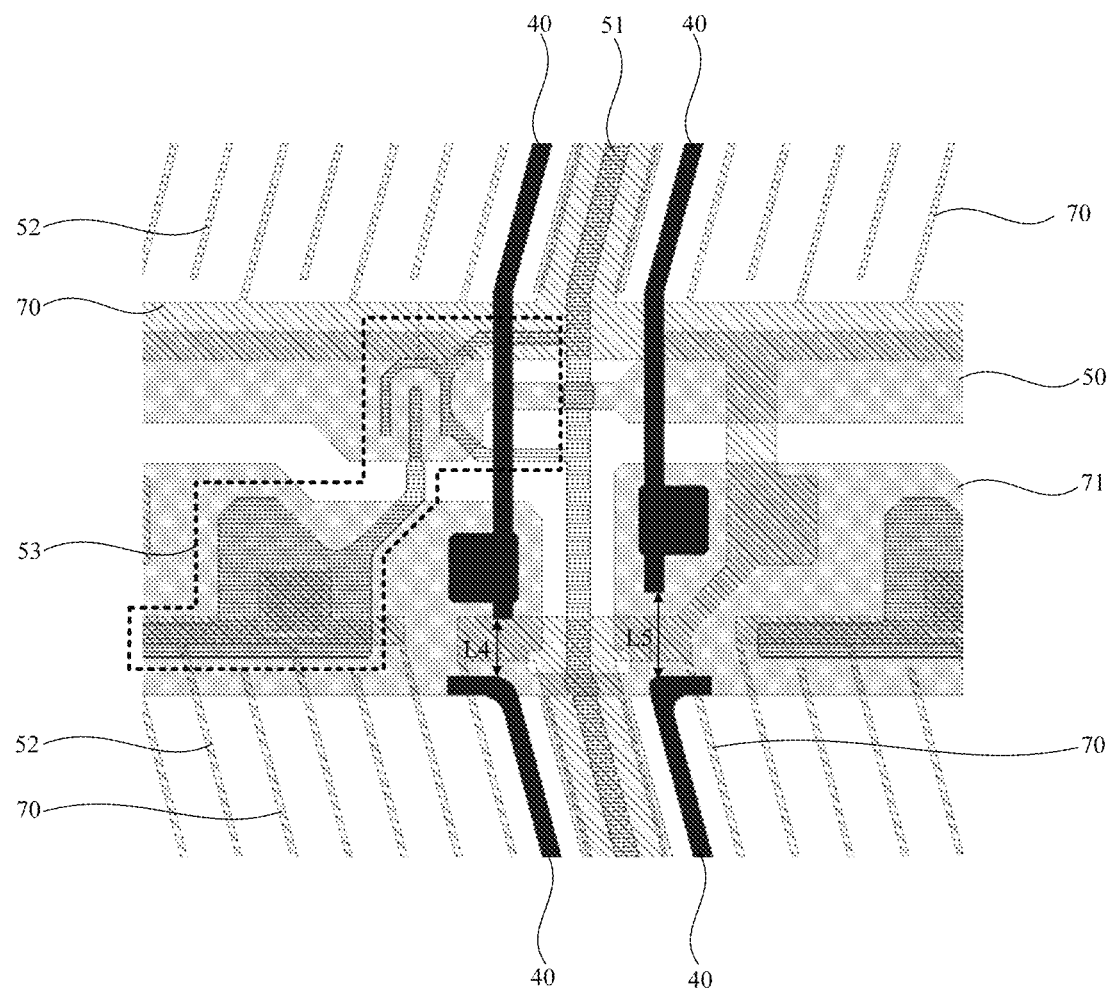
FIG. 25 is a twelfth schematic view showing the partial structure of the array substrate near the central region according to an embodiment of the present disclosure.
Figure 26:
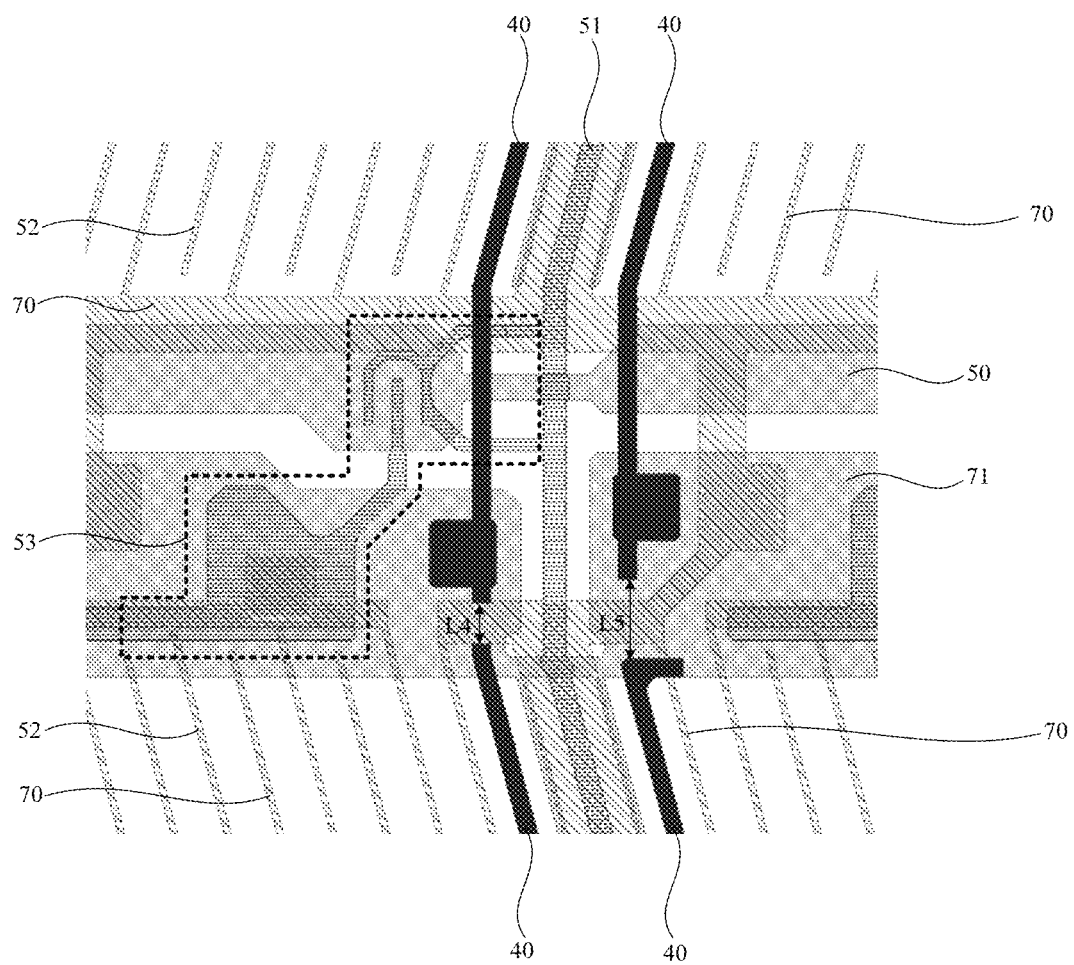
FIG. 26 is a thirteenth schematic view showing the partial structure of the array substrate near the central region according to an embodiment of the present disclosure.
Figure 27:
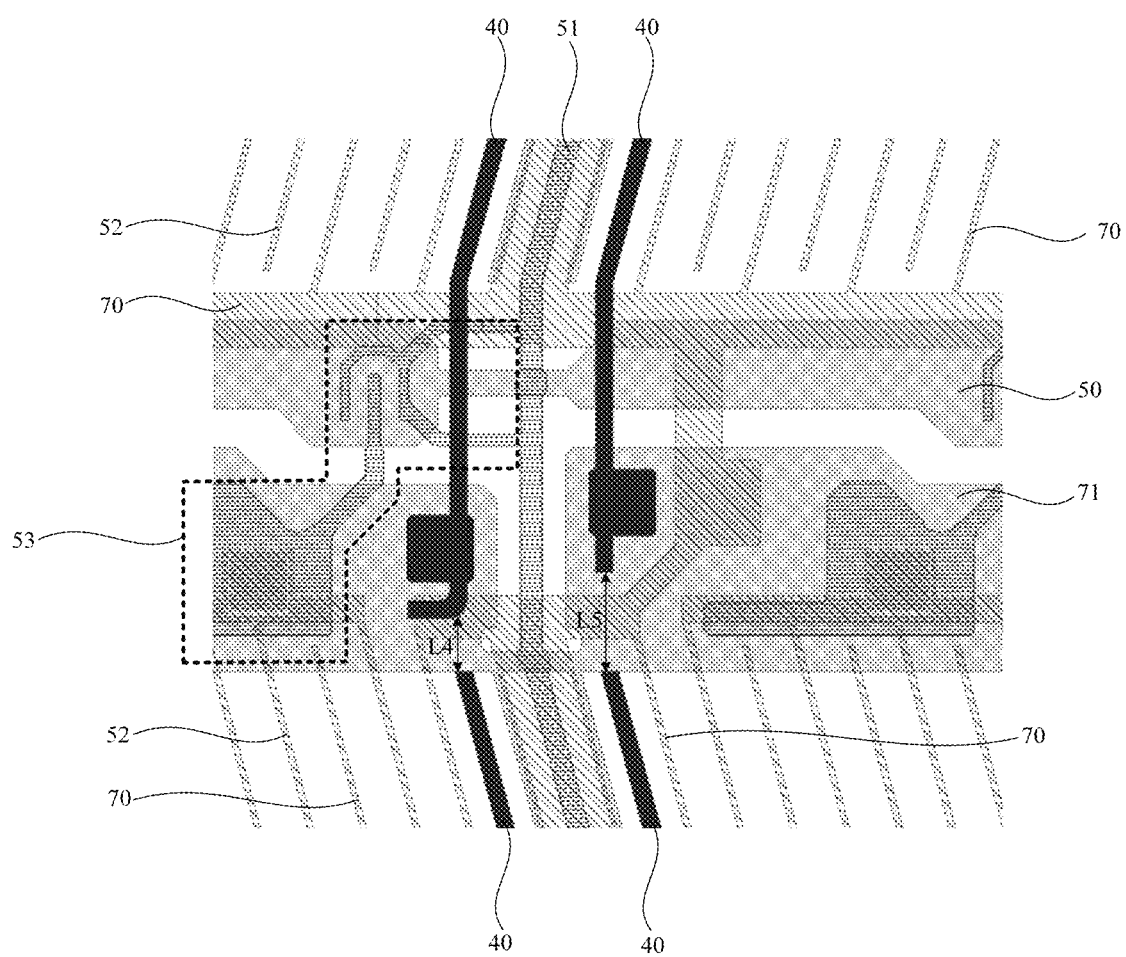
FIG. 27 is a fourteenth schematic view showing the partial structure of the array substrate near the central region according to an embodiment of the present disclosure.
Figure 28:
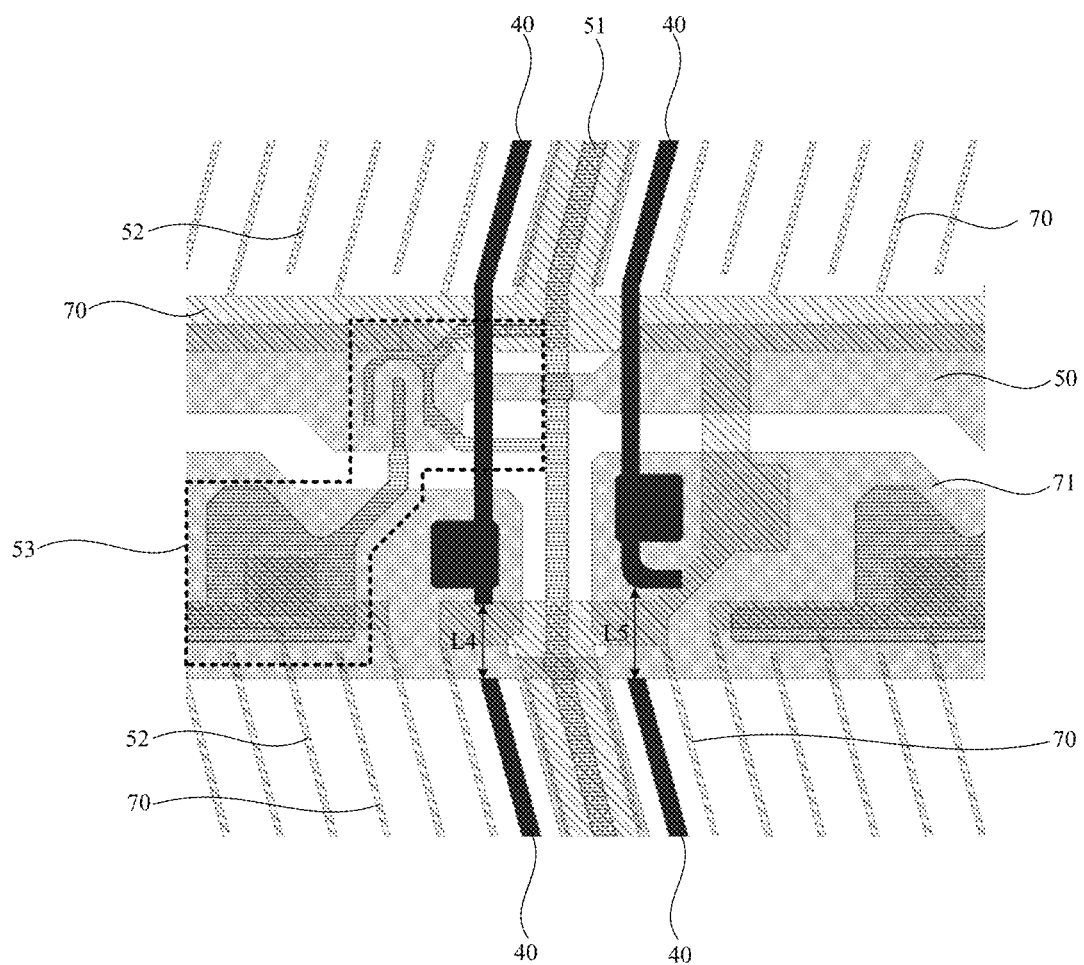
FIG. 28 is a fifteenth schematic view showing the partial structure of the array substrate near the central region according to an embodiment of the present disclosure.
Figure 29:
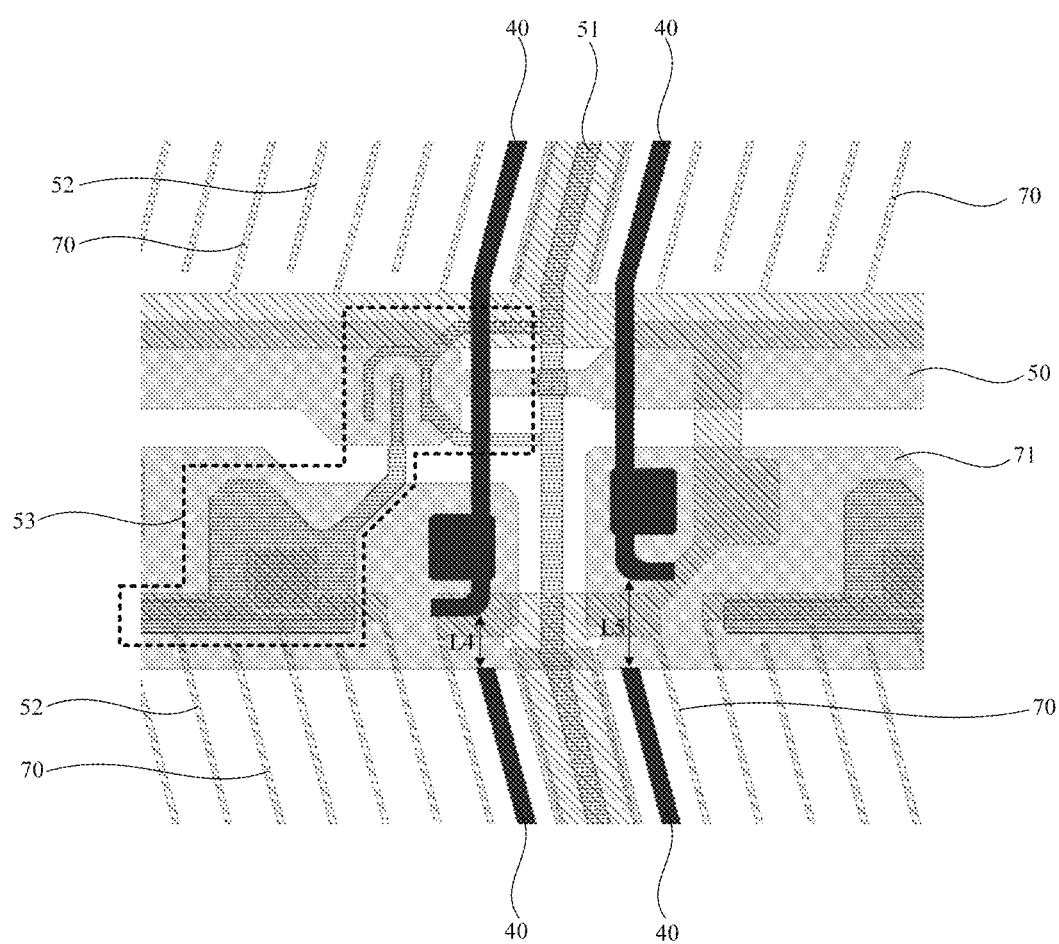
FIG. 29 is a sixteenth schematic view showing the partial structure of the array substrate near the central region according to an embodiment of the present disclosure.

As shown in FIG. 23, in some embodiments of the present disclosure, in the touch signal lines 40 arranged opposite to each other in the first direction, the end of each touch signal line 40 proximate to the central region extends in the first direction.

As shown in FIGS. 24 to 29, in some embodiments of the present disclosure, in the touch signal lines 40 arranged opposite to each other in the first direction, the end of at least one touch signal line 40 proximate to the central region extends in the second direction.

Figure 30:
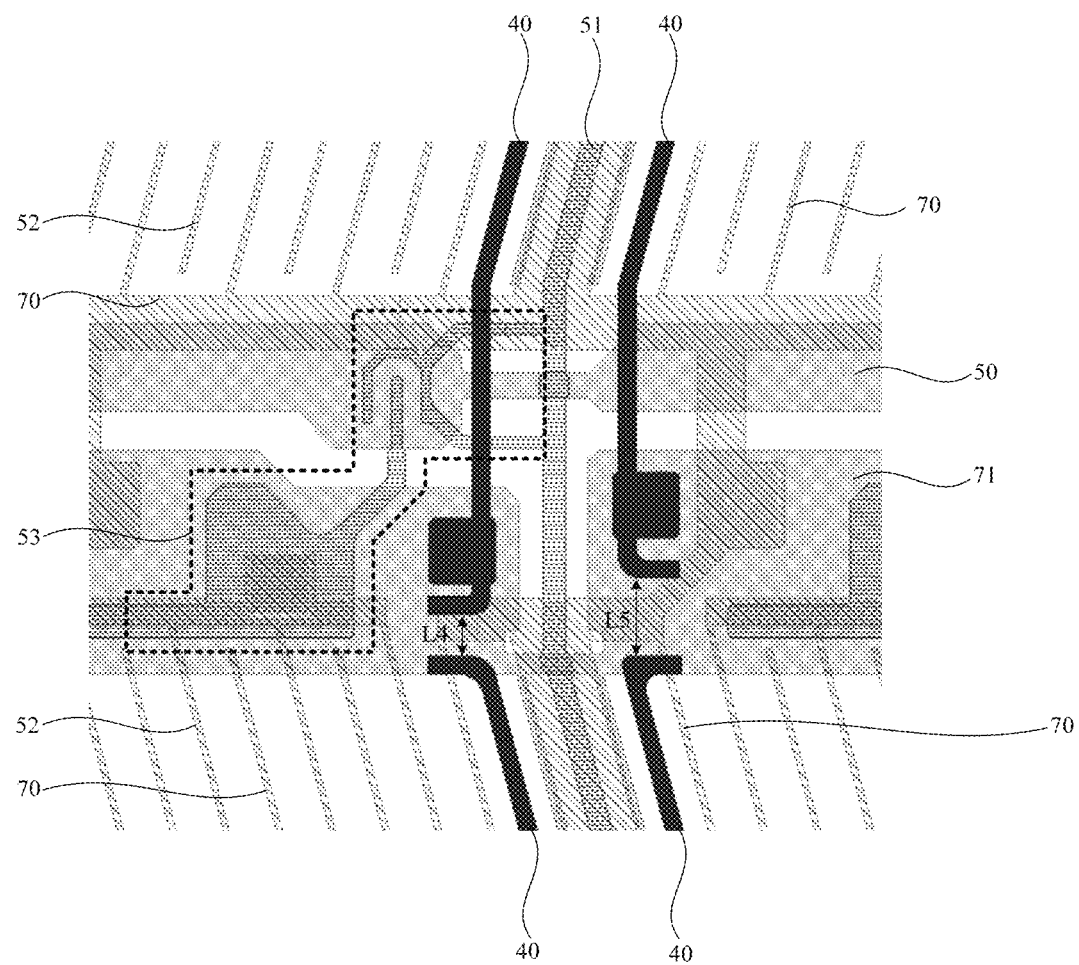
FIG. 30 is a seventeenth schematic view showing the partial structure of the array substrate near the central region according to an embodiment of the present disclosure.

As shown in FIG. 30, in some embodiments of the present disclosure, in the touch signal lines 40 arranged opposite to each other in the first direction, the end of each touch signal line 40 proximate to the central region extends in the second direction.

It should be appreciated that, in FIGS. 16 to 30, each of the protection distances L4 and L5 is greater than or equal to the electrostatic protection distance.

As shown in FIG. 4, in some embodiments of the present disclosure, the array substrate further includes:
- a plurality of data lines 51, at least a portion of each data line 51 extending in the first direction; and
- a plurality of switching elements 53 each arranged between an adjacent curved portion 402 and a corresponding data line 51.

For example, each switching element 53 includes a Thin Film Transistor (TFT), a gate electrode of which is coupled to a corresponding gate line 50, a first electrode of which is coupled to a corresponding data line 51, and a second electrode of which is coupled to a corresponding pixel electrode 52.

The TFT is turned on under the control of the corresponding gate line 50, so as to write a data signal from the corresponding data line 51 coupled thereto into the corresponding pixel electrode 52.

As shown in FIG. 6, in some embodiments of the present disclosure, the quantity of touch sensor blocks 30 in the first group of electrode blocks 31 is equal to the quantity of touch sensor blocks 30 in the second group of electrode blocks 32, and the quantity of touch signal lines 40 in the first group of touch signal lines is equal to the quantity of touch signal lines 40 in the second group of touch signal lines.

In some embodiments of the present disclosure, the quantity of touch sensor blocks 30 in the first group of electrode blocks 31 is greater than the quantity of touch sensor blocks 30 in the second group of electrode blocks 32, and the quantity of touch signal lines 40 in the first group of touch signal lines 41 is greater than the quantity of touch signal lines 40 in the second group of touch signal lines 42.

As shown in FIG. 4, in some embodiments of the present disclosure, the array substrate further includes a plurality of data lines 51, at least a portion of each data line 51 extends in the first direction, and each touch sensor block 30 includes a plurality of touch electrodes 300 electrically connected to each other and spaced apart from each other;
- at least one of the first group of touch signal lines 41 and the second group of touch signal lines 42 includes a plurality of touch signal line sub-groups 43, each touch signal line sub-group 43 include two touch signal lines 40 adjacent to each other in the second direction, orthogonal projections of the two adjacent touch signal lines 40 onto the base 10 are located at two sides of an orthogonal projection of a corresponding data line 51 onto the base 10 respectively, and each of the orthogonal projections of the two adjacent touch signal lines 40 and the orthogonal projection of the data line 51 includes a portion arranged between orthogonal projections of two adjacent touch electrodes 300 onto the base.

For example, the plurality of touch signal line sub-groups 43 is arranged in the second direction.

For example, each touch signal line sub-group 43 includes at least one touch signal line 40 arranged in the second direction.

For example, each touch signal line sub-group 43 includes two touch signal lines 40 adjacent to each other in the second direction.

For example, each touch signal line 40 merely belongs to one touch signal line sub-group 43.

For example, the touch signal line sub-groups 43 correspond to the data lines 51 respectively, and the orthogonal projections of two adjacent touch signal lines 40 onto the base 10 are located at two sides of the orthogonal projection of the corresponding data line 51 onto the base 10.

When each of the orthogonal projections of the two adjacent touch signal lines 40 and the orthogonal projection of the data line 51 includes a portion arranged between the orthogonal projections of two adjacent touch electrodes 300 onto the base, it is able to reduce an area of a pixel aperture region shielded by the touch signal line 40, thereby to ensure a pixel aperture ratio in a better manner.

In some embodiments of the present disclosure, the two adjacent touch signal lines 40 are arranged at a layer different from the data line 51.

Through the above-mentioned arrangement mode, it is able to prevent the occurrence of the short circuit between the touch signal line 40 and the data line 51, thereby to ensure the reliability of the array substrate.

In addition, through the above-mentioned arrangement mode, it is also able to reduce the distance between the orthogonal projection of the touch signal line 40 onto the base 10 and the orthogonal projection of the data line 51 onto the base 10, thereby to reduce the difficulty in the arrangement of the touch signal line 40 and further improve the pixel aperture ratio.

Figure 10:
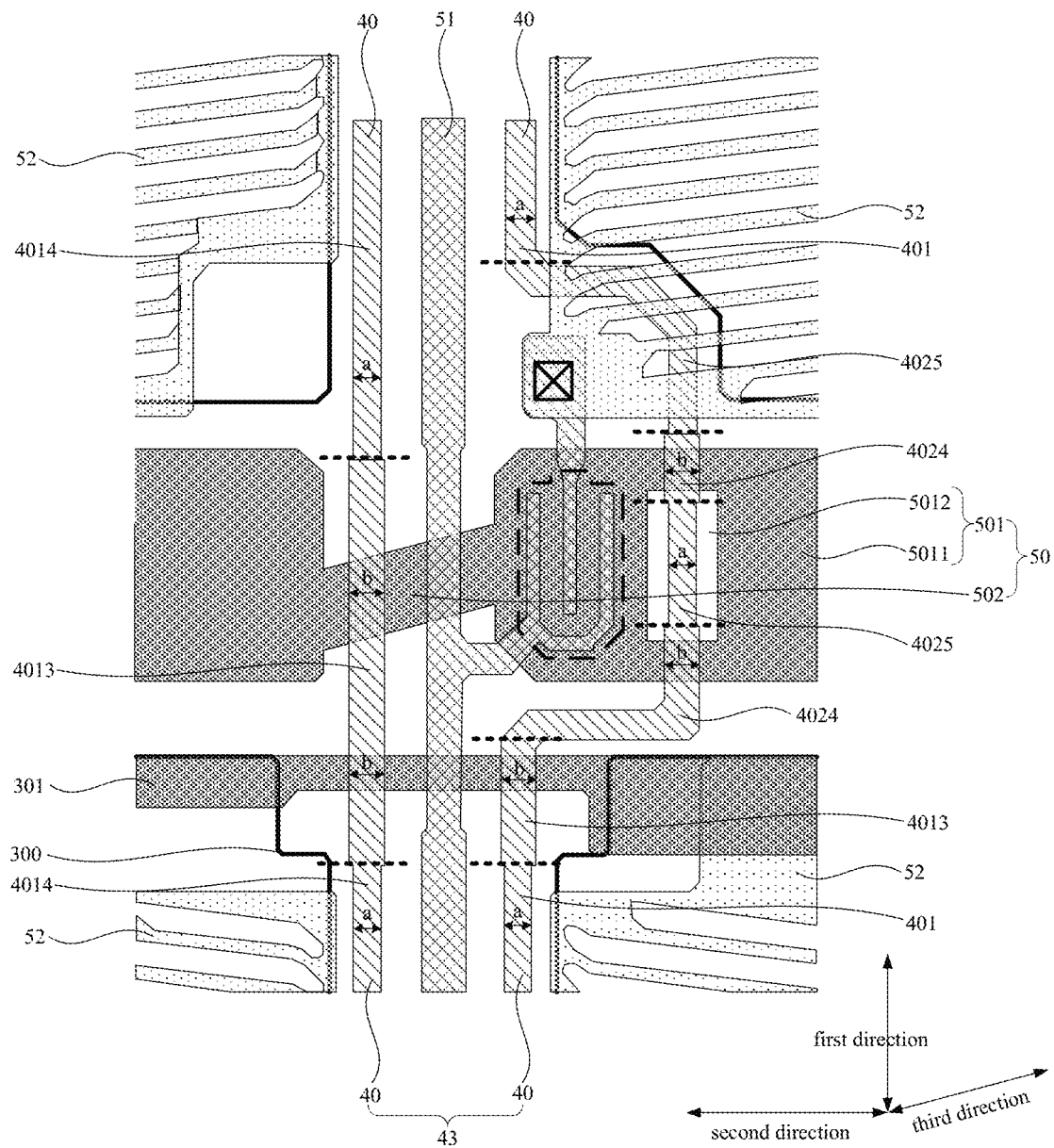
FIG. 10 is a schematic view showing adjacent subpixel regions of the array substrate according to an embodiment of the present disclosure.
Figure 11:
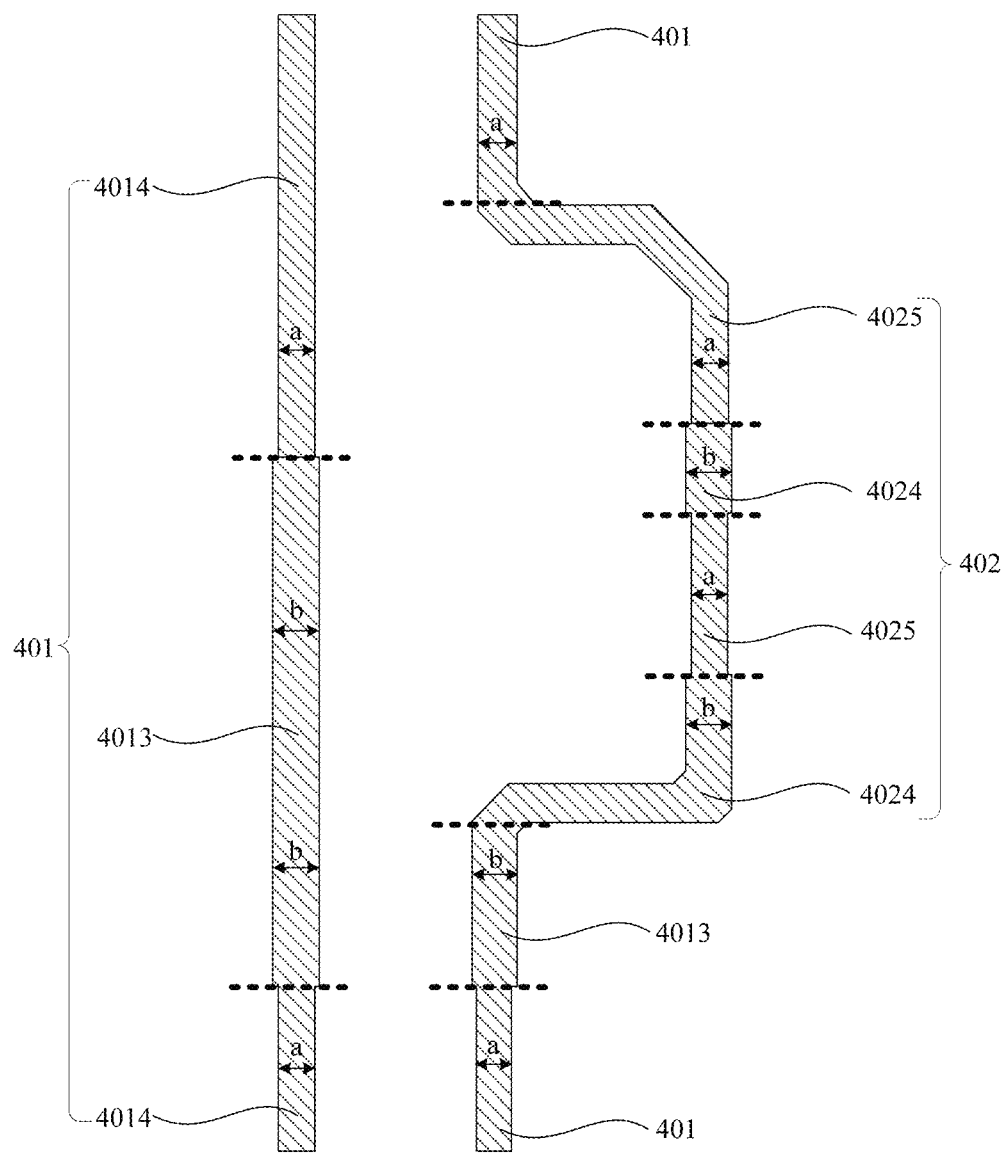
FIG. 11 is a schematic view showing touch signal lines in FIG. 10.

As shown in FIGS. 10 and 11, in some embodiments of the present disclosure, the array substrate further includes a plurality of gate lines 50, and at least a portion of each gate line 50 extends in the second direction. Each of at least a part of the linear portions 401 includes a first sub-portion 4013 and a second sub-portion 4014 coupled to each other, a width b of the first sub-portion 4013 is greater than a width a of the second sub-portion 4014 in a direction parallel to the base 10 and perpendicular to an extension direction of the touch signal line 40, and an orthogonal projection of the first sub-portion 4013 onto the base 10 covers an orthogonal projection of at least a portion of a side surface of a corresponding gate line 50 onto the base 10; and/or each of at least a part of the curved portions 402 includes a third sub-portion 4024 and a fourth sub-portion 4025 coupled to each other, a width b of the third sub-portion 4024 is greater than a width a of the fourth sub-portion 4025 in the direction parallel to the base 10 and perpendicular to the extension direction of the touch signal line 40, and an orthogonal projection of the third sub-portion 4024 onto the base 10 covers an orthogonal projection of at least a portion of a side surface of a corresponding gate line 50 onto the base 10.

For example, the first sub-portion 4013 and the second sub-portion 4014 are formed integrally.

For example, the third sub-portion 4024 and the fourth sub-portion 4025 are formed integrally.

For example, each touch signal line 40 is arranged at a side of the gate line 50 distal to the base 10, and an insulation layer is arranged between the touch signal line 40 and the gate line 50.

Through the above-mentioned arrangement mode, it is able to increase a width of a portion of the touch signal line 40 overlapping the side surface of the gate line 50 (i.e., a surface of the gate line 50 where a segment difference is formed), thereby to prevent the portion of the touch signal line 40 overlapping the side surface of the gate line 50 from being broken.

It should be appreciated that, a design standard of the width b will be described as follows. (1) The width b is related to a thickness of the gate line 50 in the direction perpendicular to the base 10. The larger the thickness of the gate line 50, the larger the possibility that the portion of the touch signal line 40 overlapping the gate line 50 is to be broken. In order to prevent the touch signal line 40 from being broken, the width b is set to have a relatively large value, usually between 6 µm to 20 µm. (2) An overlapping capacitance is generated between the touch signal line 40 and the gate line 50, and in order to prevent the occurrence of a too large overlapping capacitance, the value of the width b shall be as small as possible when it has met the condition (1).

A design standard of the width a will be described as follows. (1) A resistance of the touch signal line 40 needs to meet a requirement. The larger the width a of the touch signal line 40, the smaller the resistance of the touch signal line 40. (2) A lateral field capacitance between the touch signal line 40 and the other conductive structure needs to be reduced. The lateral field capacitance is related to the width of the touch signal line 40 as well as a distance between the touch signal line 40 and the other conductive structure. The smaller the width of the touch signal line 40 and the larger the distance between the touch signal line 40 and the other conductive structure, the smaller the lateral field capacitance between the touch signal line 40 and the other conductive structure.

As mentioned above, when the width b of the first sub-portion 4013 is greater than the width a of the second sub-portion 4014 and the width b of the third sub-portion 4024 is greater than the width a of the fourth sub-portion 4025, it is able to reduce the width of a portion of the touch signal line 40 and reduce a horizontal distance between the touch signal line and the other conductive structure, thereby to provide a small lateral field capacitance between the touch signal line 40 and the other conductive structure (the gate line 50, the data line 51, the pixel electrode 52, the touch electrode 300, etc.) while meeting the requirement on the resistance of the touch signal line 40.

As shown in FIGS. 10 and 11, in some embodiments of the present disclosure, each gate line 50 includes a plurality of gate patterns 501 and a plurality of gate connection members 502 arranged alternately in the second direction, adjacent gate patterns 501 are coupled to each other via a corresponding gate connection member 502, each gate pattern 501 has a width greater than the gate connection member 502 in the first direction;
  the orthogonal projection of the first sub-portion 4013 onto the base 10 covers an orthogonal projection of at least a portion of a side surface of the gate connection member 502 onto the base 10, and the orthogonal projection of the third sub-portion 4024 onto the base 10 covers an orthogonal projection of at least a portion of a side surface of the gate pattern 501 onto the base 10.

For example, the gate patterns 501 and the gate connection members 502 of the same gate line 50 are formed integrally.

For example, the gate pattern 501 is reused as the gate electrode of the switching element 53.

As mentioned above, when the orthogonal projection of at least a portion of the first sub-portion 4013 onto the base 10 covers the orthogonal projection of at least a portion of the side surface of the gate connection member 502 onto the base 10, it is able prevent the first sub-portion 4013 from being easily broken at a region where the first sub-portion 4013 overlaps at least a portion of the side surface of the gate connection member 502, and reduce an overlapping capacitance formed between the first sub-portion 4013 and the gate line 50.

Identically, when the orthogonal projection of at least a portion of the third sub-portion 4024 onto the base 10 covers the orthogonal projection of at least a portion of the side surface of the gate patter 501 onto the base 10, it is able to prevent the third sub-portion 4024 from being easily broken at a region where the third sub-portion 4024 overlaps at least a portion of the side surface of the gate pattern 501.

Through the above-mentioned arrangement mode, when the width of the gate pattern 501 is greater than the width of the gate connection member 502 in the first direction, it is able to effectively reduce the resistance of the gate line 50.

In some embodiments of the present disclosure, the first sub-portion 4013 extends in the first direction, and the gate connection member 502 extends in a third direction angled relative to the first direction at an angle smaller than 90°.

Through the above-mentioned arrangement mode, it is able to increase an area of the first sub-portion 4013 in contact with the gate connection member 502 at a position where a segment difference is formed, thereby to prevent the first sub-portion 4013 from being broken.

In a possible embodiment of the present disclosure, each of at least a part of the gate patterns 501 includes a solid region 5011 and a first hollowed-out region 5012, an orthogonal projection of the solid region 5011 onto the base 10 at least partially overlaps the orthogonal projection of the third sub-portion 4024 onto the base 10, and an orthogonal projection of the first hollowed-out region 5012 onto the base 10 at least partially overlaps an orthogonal protection of the fourth sub-portion 4025 onto the base 10.

Through the above-mentioned arrangement mode, it is able to prevent a portion of the third sub-portion 4024 overlapping the solid region 5011 from being easily broken.

As mentioned above, when the orthogonal projection of the first hollowed-out region 5012 onto the base 10 at least partially overlaps the orthogonal projection of the fourth sub-portion 4025 onto the base 10, it is able to effectively reduce a coupling capacitance formed between the touch signal line 40 and the gate line 50.

Figure 13:
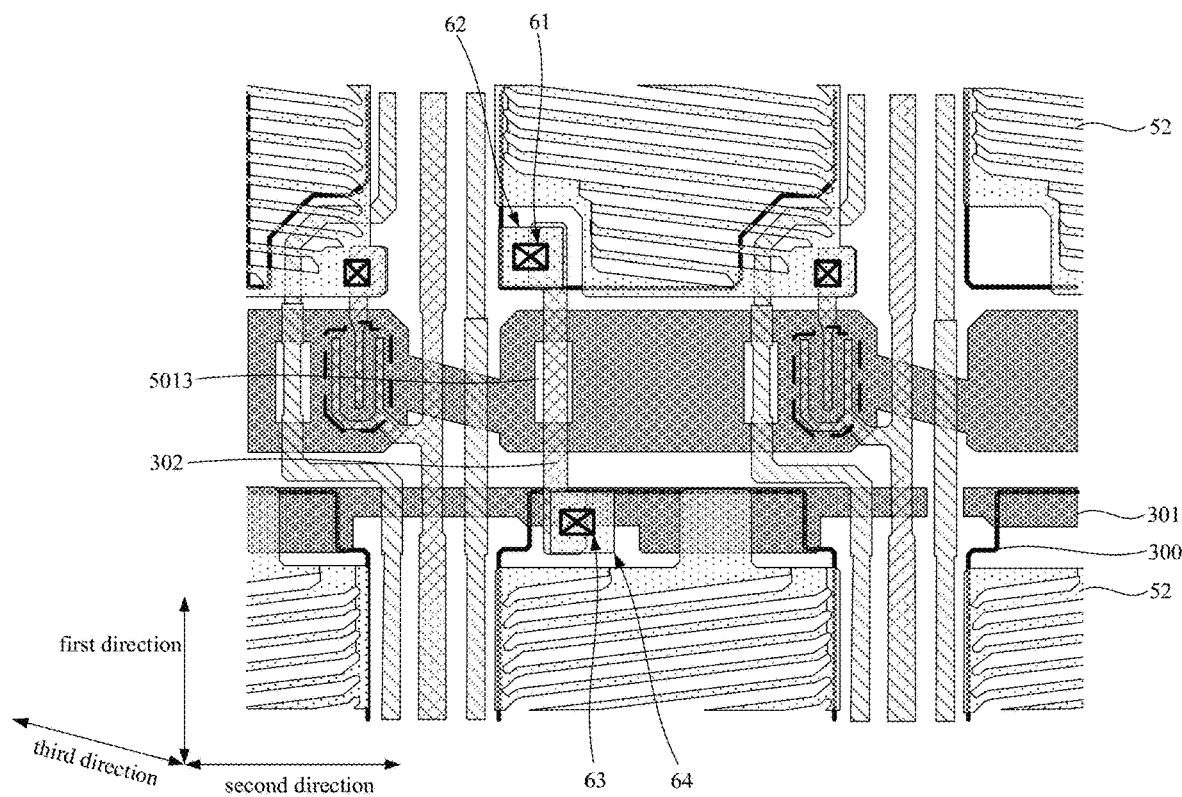
FIG. 13 is a partially schematic view showing a touch sensor block according to an embodiment of the present disclosure.

As shown in FIGS. 12 and 13, in some embodiments of the present disclosure, each touch sensor block 30 includes a plurality of touch electrodes 300 electrically connected to each other, spaced apart from each other and arranged in an array form, the plurality of touch electrodes 300 includes touch electrodes 300 arranged in rows in the first direction, and the touch electrodes 300 in each row include a plurality of touch electrodes 300 arranged in the second direction;
  each touch sensor block 30 further includes:
    a plurality of first common connection members 301 corresponding to the rows of touch electrodes 300 respectively, each first common connection member 301 being coupled to the touch electrodes 300 in a corresponding row; and
    a plurality of second common connection members 302, two adjacent rows of touch electrodes 300 being coupled to each other via at least one of the second common connection members 302.

For example, the touch electrodes 300 are arranged independent of each other and spaced apart from each other. The touch electrodes 300 correspond to the subpixel regions in the array substrate respectively, and at least a portion of each touch electrode 300 is located at the corresponding subpixel region.

For example, at least a portion of each first common connection member 301 extends in the second direction, and the touch electrodes 300 in the touch electrodes in a corresponding row are electrically connected to each other via the first common connection member 301.

For example, the first common connection member 301 is arranged substantially parallel to the gate line 50.

For example, in a same touch sensor block 30, the two adjacent rows of touch electrodes 300 are coupled to each other via a plurality of second common connection members 302 spaced apart from each other.

For example, in the plurality of second common connection members 302, every two adjacent second common connection members 302 are spaced apart from each other by a distance at least equal to a sum of widths of three touch electrodes 300.

In the above-mentioned array substrate, the touch electrodes 300 spaced apart from each other are electrically connected to each other through the first common connection member 301 and the second common connection member 302 to form one touch sensor block 30. Each touch electrode 300 is reused in a time-division manner, i.e., it is used as a common electrode during the display and used to achieve a touch function during the touch.

In some embodiments of the present disclosure, the array substrate further includes a plurality of gate lines 50, at least a portion of each gate line 50 extends in the second direction, and the first common connection member 301 is arranged in a same layer, and made of a same material, as the gate line 50.

Through the above-mentioned arrangement mode, the first common connection member 301 and the gate line 50 are formed through a single patterning process, so it is able to simplify a manufacture process of the array substrate and reduce the manufacture cost thereof.

In some embodiments of the present disclosure, the first common connection member 301 is directly lapped onto a surface of each touch electrode 300 in a corresponding row, so that the first common connection member is connected to the touch electrode.

For example, there is no insulation layer between the first common connection member 301 and the touch electrode 300. After the manufacture of the touch electrode 300, the first common connection member 301 is directly formed, i.e., directly lapped onto the surface of each touch electrode 300 in a corresponding row.

For example, the touch electrode 300 is made of a transparent conductive material, e.g., ITO or indium zinc oxide (IZO).

Figure 9:
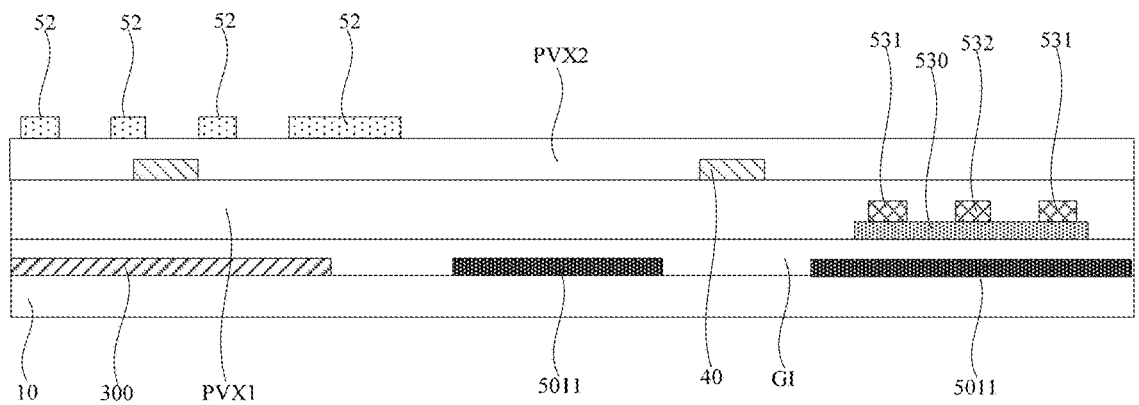
FIG. 9 is a sectional view of the array substrate along a line D1-D2 in FIG. 7.

As shown in FIG. 9, for example, the array substrate is manufactured as follows. At first, a first ITO layer (i.e., a 1ITO layer) is formed, and a first gate metal layer is formed at a side of the 1ITO layer distal to the base. Next, a gate insulation layer GI is formed at a side of the first gate metal layer distal to the base 10, an active layer is formed at a side of the gate insulation layer GI distal to the base 10, a source/drain metal layer is formed at a side of the active layer distal to the base 10, a first passivation layer PVX1 is formed at a side of the source/drain metal layer distal to the base 10, a touch signal line 40 layer is formed at a side of the first passivation layer PVX1 distal to the base 10, a second passivation layer PVX2 is formed at a side of the touch signal line 40 layer distal to the base 10, and then a second ITO layer (i.e., a 2ITO layer) is formed at a side of the second passivation layer PVX2 distal to the base 10.

It should be appreciated that, FIG. 9 further shows an active pattern 530, a first electrode 531 and a second electrode 532 of the switching element 53. In FIG. 7, a dotted box at the switching element 53 represents the active pattern 530.

For example, the 1ITO layer includes the touch electrodes 300, the first gate metal layer includes the gate lines 50 and the first common connection members 301, the active layer includes the active pattern of each switching element 53, the source/drain metal layer includes the data lines 51 and the first electrode and the second electrode of each switching element 53, the touch signal line 40 layer includes the touch signal lines 40, and the 2ITO layer includes the pixel electrodes 52.

It should be appreciated that, the pixel electrode 52 is also formed through the 1ITO layer, and the touch electrode 300 is also formed through the 2ITO layer. In this case, the other structures of the array substrate are changed correspondingly.

In some embodiments of the present disclosure, a spacer region is provided between the first common connection members 301 adjacent to each other in the second direction, and the spacer region has a width greater than or equal to 5 μm in the second direction. An exposure machine is provided with a sufficient resolution to provide the spacer region with a width of 5 μm. The first common connection members 301 are arranged in the form of segments in the second direction, and it is impossible to cause the ESD due to a large quantity of accumulated charges, so it is able to prevent the first common connection members from being short-circuited when the width of the spacer region is 5 μm.

For example, in the touch sensor blocks 30 adjacent to each other in the second direction, the spacer region is provided between the first common connection members 301 of the touch sensor blocks 30.

Through the above-mentioned arrangement mode, the first common connection members 301 adjacent to each other in the second direction are spaced apart from each other by a relatively large distance, so it is able to prevent the short circuit between the first common connection members 301 adjacent to each other in the second direction.

In some embodiments of the present disclosure, the array substrate further includes a plurality of data lines 51, and at least a portion of each data line 51 extends in the first direction. An orthogonal projection of an end of at least one of the two first common connection members 301 adjacent to each other in the second direction facing the spacer region onto the base 10 overlaps an orthogonal projection of the data line 51 onto the base 10 at a first overlapping region, and the first overlapping region has a width equal to the data line in the second direction.

For example, in the array substrate, the overlapping region between each data line 51 and the first common connection member 301 has a same area.

Through the above-mentioned arrangement mode, it is able to provide a same parasitic capacitance between each data line 51 and the first common connection member 301, thereby to prevent the occurrence of non-uniform charging rate for the subpixels.

In some embodiments of the present disclosure, the array substrate further includes a plurality of data lines 51, at least a portion of each data line 51 extends in the first direction, and the second common connection member 302 is arranged in a same layer, and made of a same material, as the data line 51.

Through the above-mentioned arrangement mode, the second common connection member 302 and the data line 51 are formed through a single patterning process, so as to simplify the manufacture process of the array substrate, and reduce the manufacture cost thereof.

In some embodiments of the present disclosure, the second common connection member 302 is arranged in a same layer, and made of a same material, as the touch signal line 40, so as to form them through a single patterning process.

As shown in FIG. 13, in some embodiments of the present disclosure, each first common connection member 301 is arranged at a first side of each touch electrode 300 in a corresponding row in the first direction;

at least a portion of each second common connection member 302 extends in the first direction, a first end of the second common connection member 302 is coupled to the first common connection member 301 coupled to the touch electrodes 300 in one of the two adjacent rows, and a second end of the second common connection member 302 is coupled to at least one touch electrode 300 of the touch electrodes 300 in the other of the two adjacent rows.

For example, an orthogonal projection of the first end of the second common connection member 302 onto the base 10 overlaps an orthogonal projection of the first common connection member 301 coupled to the touch electrodes 300 in one of the two adjacent rows onto the base 10, and the first end of the second common connection member 302 is coupled to the first common connection member 301 coupled to the touch electrodes 300 in one of the two adjacent rows through a first via-hole 63 and a first connection member 64 at an overlapping region. For example, the first connection member 64 is made of the 2ITO layer.

For example, the first end of the second common connection member 302 is coupled to the first common connection member 301 coupled to the touch electrodes 300 in one of the two adjacent rows through the first connection member 64 in the first via-hole 63.

For example, an orthogonal projection of the second end of the second common connection member 302 onto the base 10 overlaps an orthogonal projection of at least one touch electrode 300 of the touch electrodes 300 in the other of the two adjacent rows onto the base 10, and the second end of the second common connection member 302 is coupled to the at least one touch electrode 300 of the touch electrodes 300 in the other of the two adjacent rows through a second via-hole 61 and a second connection member 62 at an overlapping region. For example, the second connection member 62 is made of the 2ITO layer.

For example, the second end of the second common connection member 302 is coupled to the at least one touch electrode 300 of the touch electrodes 300 in the other of the two adjacent rows through the second connection member 62 in the second via-hole 61.

For example, the first via-hole 63 and the second via-hole 61 are formed through a single patterning process, and the first connection member 64 and the second connection member 62 are formed through a single patterning process.

In the above-mentioned array substrate, the two adjacent rows of touch electrodes 300 in one touch sensor block 30 are electrically connected to each other through the second common connection member 302.

As shown in FIG. 3, in some embodiments of the present disclosure, the array substrate further includes a plurality of gate lines 50, at least a portion of each gate line 50 extends in the second direction, each of at least a part of the gate lines 50 is provided with a second hollowed-out region 5013, and an orthogonal projection of the second common connection member 302 onto the base 10 overlaps an orthogonal projection of the second hollowed-out region 5013 onto the base 10.

Through the above-mentioned arrangement mode, it is able to effectively reduce an overlapping area between the second common connection member 302 and the gate line 50, thereby to reduce the parasitic capacitance formed therebetween.

Figure 14:
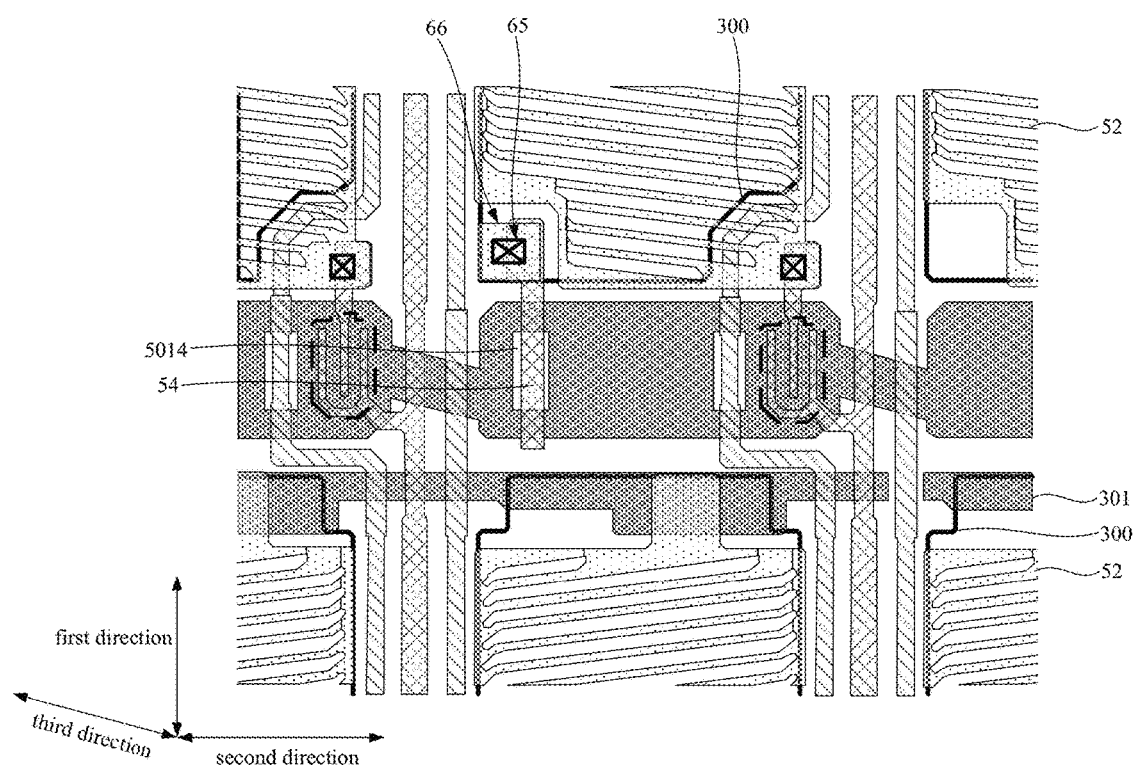
FIG. 14 is a schematic view showing a portion between adjacent touch sensor blocks in a first direction according to an embodiment of the present disclosure.
Figure 15:
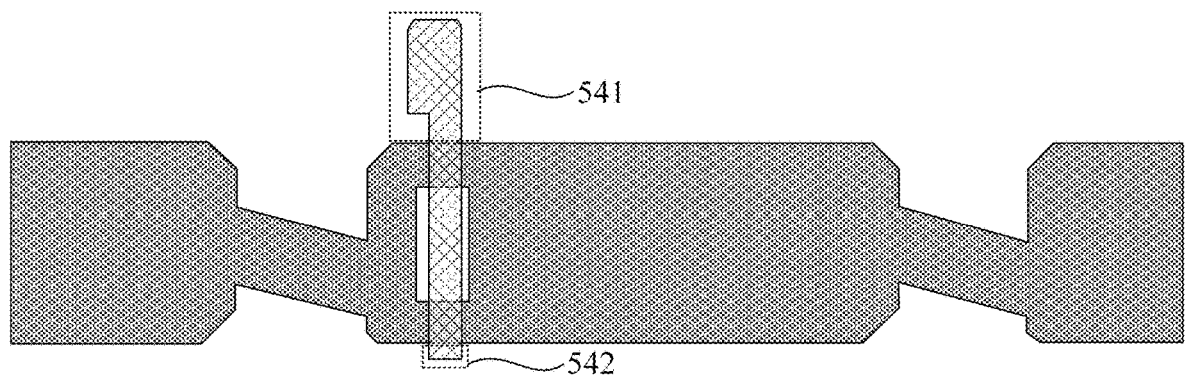
FIG. 15 is a schematic view showing a third common connection member and a gate line in FIG. 14.

As shown in FIGS. 14 and 15, in some embodiments of the present disclosure, each touch sensor block 30 includes a plurality of touch electrodes 300 electrically connected to each other and spaced apart from each other; the array substrate further includes:

a plurality of gate lines 50, at least a portion of each gate line 50 extending in the second direction; and a plurality of third common connection members 54. At least one third common connection member 54 is arranged between the touch sensor blocks 30 adjacent to each other in the first direction, at least a portion of each third common connection member 54 extends in the first direction, a first end 541 of each third common connection member 54 is coupled to the touch electrodes 300 in a first touch sensor block 30 of two adjacent touch sensor blocks 30, a second end 542 of each third common connection member 54 is not coupled to a second touch sensor block 30 of the two adjacent touch sensor blocks 30, an orthogonal portion of at least a portion of each third common connection member 54 onto the base 10 overlaps an orthogonal projection of the gate line 50 onto the base 10 at a second overlapping region, an orthogonal projection of at least a portion of each second common connection member 54 onto the base 10 overlaps the orthogonal projection of the gate line 50 onto the base 10 at a third overlapping region, and the second overlapping region has a width equal to the third overlapping region in the first direction.

For example, the third common connection member 54 is arranged in a same layer, and made of a same material, as the data line 51 or the touch signal line 40.

For example, the quantity of the third common connection members 54 between the two adjacent touch sensor blocks 30 in the first direction is equal to the quantity of the second common connection members 302 between the two adjacent rows of touch electrodes 300 in one touch sensor block 30.

For example, an orthogonal projection of the first end 541 of the third common connection member 54 onto the base 10 overlaps orthogonal projections of the touch electrodes 300 in the first touch sensor block 30 in the two adjacent touch sensor blocks 30 onto the base 10, and the first end 541 of the third common connection member 54 is coupled to the touch electrodes 300 in the first touch sensor block 30 at the overlapping region through a third via-hole 65 and a third connection member 66.

For example, the first end 541 of the third common connection member 54 is coupled to the touch electrodes 300 in the first touch sensor block 30 through the third connection member 66 in the first via-hole 65.

For example, the third via-hole 65, the first via-hole 61 and the second via-hole 63 are formed through a single patterning process, and the third connection member 66, the first connection member 62 and the second connection member 64 are formed through a single patterning process.

Through the above-mentioned arrangement mode, when the second end 542 of the third common connection member 54 is not coupled to the second touch sensor block 30 in the two adjacent touch sensor blocks 30, it is able for the touch sensor blocks 30 adjacent to each other in the first direction to be insulated from each other.

Through the above-mentioned arrangement mode, when the orthogonal projection of at least a portion of the second common connection member 302 onto the base overlaps the orthogonal projection of the gate line 50 onto the base at the third overlapping region having a width equal to the second overlapping region in the first direction, it is able to provide an uniform parasitic capacitance between each gate line 50 and the first common connection member 301 and/or the second common connection member 302, thereby to prevent the occurrence of signal delay for some gate lines 50 and the occurrence of non-uniform charging rate for some subpixels.

As shown in FIGS. 14 and 15, in some embodiments of the present disclosure, each of at least a part of the gate lines 50 is provided with a third hollowed-out region 5014, and an orthogonal projection of the third common connection member 54 onto the base 10 at least partially overlaps an orthogonal projection of the third hollowed-out region 5014 onto the base 10.

Through the above-mentioned arrangement mode, it is able to effectively reduce an overlapping area between the third common connection member 54 and the gate line 50, thereby to reduce the parasitic capacitance therebetween.

As shown in FIGS. 14 and 15, in some embodiments of the present disclosure, an orthogonal projection of the second end 542 of each third common connection member 54 onto the base 10 does not overlap the orthogonal projection of the gate line 50 onto the base 10.

For example, the third common connection member 54 extends in the first direction, the first end 541 of the third common connection member 54 is coupled to the touch electrodes 300 in the first touch sensor block 30 of the two adjacent touch sensor blocks 30, the second end 542 of the third common connection member 54 is not coupled to the second touch sensor block 30 of the two adjacent touch sensor blocks 30, and a portion of the third common connection member 54 between the first end and the second end overlaps the gate line 50.

A length of the second end 542 of the third common connection member 54 in the first direction is greater than or equal to 1 μm. For example, the length of the second end 542 of the third common connection member 54 in the first direction is within a range of 1 μm and 2 μm, with the end points inclusive.

Through the above-mentioned arrangement mode, it is able to ensure the overlapping area between the third common connection member 54 and the gate line 50, hereby to provide a uniform parasitic capacitance between each gate line 50 and the first common connection member 301 and/or the second common connection member 302.

As shown in FIGS. 14 and 15, in some embodiments of the present disclosure, the orthogonal projection of the second end 542 of each third common connection member 54 onto the base 10 does not overlap an orthogonal projection of the first common connection member 301 in the second touch sensor block 30 of the adjacent touch sensor blocks 30 onto the base 10.

Through the above-mentioned arrangement mode, it is able to reduce the parasitic capacitance between the adjacent touch sensor blocks 30, thereby to ensure the operation stability of the array substrate.

The present disclosure further provides in some embodiments a touch display device including the above-mentioned array substrate.

According to the embodiments of the present disclosure, the entire array substrate is divided into two parts arranged in the first direction and capable of being used to control a touch operation separately. During the arrangement of the touch signal lines 40, it is unnecessary for each touch signal line 40 to extend across the entire array substrate in the first direction, and instead, it is merely necessary for it to extend across a region where a corresponding group of electrode blocks is located. In this way, it is able to reduce a space desired for the arrangement of the touch signal lines 40, thereby to remarkably reduce the difficulty in the arrangement of the touch signal lines 40 in a large-size array substrate. In addition, it is able to improve an aperture ratio of each subpixel in the array substrate during the arrangement of the touch signal line 40. In addition, based on the above-mentioned arrangement mode, the touch signal lines 40 in the entire array substrate are divided into two groups, and each group of touch signal lines 40 are coupled to a corresponding control unit. In this way, it is able to drive the array substrate from two sides, thereby to effectively reduce the difficulty in the connection between the touch signal line 40 and the control unit.

Hence, when the touch display device includes the above-mentioned array substrate, it also has the above-mentioned beneficial effects, which will not be particularly further defined herein.

In some embodiments of the present disclosure, the touch display device further includes an opposite substrate and a liquid crystal layer, the opposite substrate is arranged opposite to the array substrate, and the liquid crystal layer is arranged between the opposite substrate and the array substrate.

For example, the opposite substrate includes a color filter substrate.

Liquid crystal molecules in the liquid crystal layer are deflected under the control of the pixel electrode 52 and the common electrode, so as to achieve a display function of the touch display device.

It should be appreciated that, the touch display device is any product or member having a display function, e.g., television, display, digital photo frame, mobile phone or tablet computer.

It should be further appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure. As a result, a protection scope of the present disclosure is defined by claims.

What is claimed is:

1. An array substrate, comprising:
a base;
a first control unit and a second control unit arranged opposite to each other in a first direction;
a plurality of touch sensor blocks arranged independent of each other and arranged on the base in an array form, wherein the plurality of touch sensor blocks comprises a first group of electrode blocks and a second group of electrode blocks, and a first group of electrode blocks and a second group of electrode blocks are arranged in the first direction; and
a plurality of touch signal lines arranged independent of each other, wherein at least a portion of each of the touch signal lines extends in the first direction, the plurality of touch signal lines comprises a first group of touch signal lines and a second group of touch signal lines, and the first group of touch signal lines and the second group of touch signal lines are arranged in the first direction,
wherein the first group of touch signal lines comprises a plurality of touch signal lines arranged in a second direction crossing the first direction, the touch signal lines in the first group of touch signal lines are coupled to touch sensor blocks in the first group of electrode blocks respectively, and one end of each of the touch signal lines in the first group of touch signal lines is coupled to the first control unit; and
the second group of touch signal lines comprises a plurality of touch signal lines arranged in the second direction, the touch signal lines in the second group of touch signal lines are coupled to touch sensor blocks in the second group of electrode blocks respectively, and one end of each of the touch signal lines in the second group of touch signal lines is coupled to the second control unit,
wherein each of the touch sensor blocks comprises a plurality of touch electrodes that are electrically connected to each other and spaced apart from each other, the plurality of touch electrodes is arranged in an array form and comprises touch electrodes arranged in rows in the first direction, and the touch electrodes in each row comprise a plurality of touch electrodes arranged in the second direction;
each of the touch sensor blocks further comprises:
a plurality of first common connection members corresponding to the rows of touch electrodes respectively, wherein each of the first common connection members is coupled to the touch electrodes in a corresponding row;
a plurality of second common connection members, wherein two adjacent rows of touch electrodes are coupled to each other via at least one of the second common connection members.

2. The array substrate according to claim 1, wherein each of at least a part of the touch signal lines comprises a plurality of linear portions and a plurality of curved portions arranged alternately;
an orthogonal projection of at least a part of the curved portions of one touch signal line onto the base overlaps an orthogonal projection of a pixel electrode onto the base.

3. The array substrate according to claim 2, wherein the first group of touch signal lines comprises at least one first target touch signal line, an end of the at least one first target touch signal line proximate to the second group of touch signal lines is provided with a first target curved portion, the second group of touch signal lines comprises at least one second target touch signal line, an end of the at least one second target touch signal line proximate to the first group of touch signal lines is provided with a second target curved portion, and the first target curved portion is spaced apart from the second target curved portion by a first protection distance greater than or equal to the electrostatic protection distance.

4. The array substrate according to claim 3, wherein an orthogonal projection of the first target curved portion onto the base at least partially overlaps the orthogonal projection of the subpixel electrode onto the base, and the first target curved portion comprises an extension portion extending in a direction away from the second group of touch signal lines.

5. The array substrate according to claim 2, wherein the first group of touch signal lines comprises at least one third target touch signal line, an end of the at least one third target touch signal line proximate to the second group of touch signal lines is provided with a first target linear portion, the second group of touch signal lines comprises at least one fourth target touch signal line, an end of the at least one fourth target touch signal line proximate to the first group of touch signal lines is provided with a second target linear portion, and the first target linear portion is spaced apart from the second target linear portion by a second protection distance greater than or equal to the electrostatic protection distance.

6. The array substrate according to claim 2, wherein the array substrate further comprises:
a plurality of data lines, wherein at least a portion of the data line extends in the first direction;
a plurality of switching elements each arranged between a curved portion and a data line that are adjacent to each other.

7. The array substrate according to claim 1, wherein the quantity of touch sensor blocks in the first group of electrode blocks is equal to the quantity of touch sensor blocks in the second group of electrode blocks, and the quantity of touch signal lines in the first group of touch signal lines is equal to the quantity of touch signal lines in the second group of touch signal lines.

8. The array substrate according to claim 7, wherein the array substrate further comprises a plurality of data lines, wherein at least a portion of the data line extends in the first direction;
at least one of the first group of touch signal lines and the second group of touch signal lines comprises a plurality of touch signal line sub-groups, each of the touch signal line sub-groups comprise two touch signal lines adjacent to each other in the second direction, orthogonal projections of the two adjacent touch signal lines onto the base are located at two sides of an orthogonal projection of a same data line onto the base respectively, and each of the orthogonal projections of the two adjacent touch signal lines and the orthogonal projection of the data line comprises a portion arranged between orthogonal projections of adjacent touch electrodes onto the base, wherein a layer where the two adjacent touch signal lines are located is different from a layer where the same data line is located.

9. The array substrate according to claim 2, further comprising a plurality of gate lines, wherein at least a portion of the gate line extends in the second direction, wherein each of at least a part of the linear portions comprises a first sub-portion and a second sub-portion coupled to each other, a width of the first sub-portion is greater than a width of the second sub-portion in a direction that is parallel to the base and perpendicular to an extension direction of the touch signal line, and an orthogonal projection of the first sub-portion onto the base covers an orthogonal projection of at least a portion of a side surface of the gate line onto the base; and/or each of at least a part of the curved portions comprises a third sub-portion and a fourth sub-portion coupled to each other, a width of the third sub-portion is greater than a width of the fourth sub-portion in the direction that is parallel to the base and perpendicular to the extension direction of the touch signal line, and an orthogonal projection of the third sub-portion onto the base covers an orthogonal projection of at least a portion of a side surface of the gate line onto the base, wherein the gate line comprises a plurality of gate patterns and a plurality of gate connection members, the gate patterns and the gate connection members are arranged alternately in the second direction, adjacent gate patterns are coupled to each other via the gate connection member, a width of the gate pattern is greater than a width of the gate connection member in the first direction;

the orthogonal projection of the first sub-portion onto the base covers an orthogonal projection of at least a portion of a side surface of the gate connection member onto the base; and the orthogonal projection of the third sub-portion onto the base covers an orthogonal projection of at least a portion of a side surface of the gate pattern onto the base.

10. The array substrate according to claim 9, wherein the first sub-portion extends in the first direction, and the gate connection member extends in a third direction angled related to the first direction at an angle smaller than 90°.

11. The array substrate according to claim 9, wherein each of at least a part of the gate patterns comprises a solid region and a first hollowed-out region, an orthogonal projection of the solid region onto the base at least partially overlaps the orthogonal projection of the third sub-portion onto the base, and an orthogonal projection of the first hollowed-out region onto the base at least partially overlaps an orthogonal protection of the fourth sub-portion onto the base.

12. The array substrate according to claim 1, further comprising a plurality of gate lines, wherein at least a portion of the gate line extends in the second direction, and the first common connection member is arranged in a same layer, and made of a same material, as the gate line.

13. The array substrate according to claim 1, wherein a spacer region is provided between the first common connection members adjacent to each other in the second direction, and a width of the spacer region in the second direction is greater than or equal to 5 μm, wherein the array substrate further comprises a plurality of data lines, wherein at least a portion of the data line extends in the first direction;

an end of at least one of the two first common connection members adjacent to each other in the second direction is proximate to the spacer region, an orthogonal projection of the end of at least one of the two first common connection members onto the base overlaps an orthogonal projection of the data line onto the base at a first overlapping region, and a width of the first overlapping region is equal to a width of the data line in the second direction.

14. The array substrate according to claim 1, further comprising a plurality of data lines, wherein at least a portion of the data line extends in the first direction, and the second common connection member is arranged in a same layer, and made of a same material, as the data line.

15. The array substrate according to claim 1, wherein the first common connection member is arranged at a first side of the touch electrodes in a corresponding row in the first direction;

at least a portion of the second common connection member extends in the first direction, a first end of the second common connection member is coupled to the first common connection member coupled to the touch electrodes in one of the two adjacent rows, and a second end of the second common connection member is coupled to at least one of the touch electrodes in the other of the two adjacent rows.

16. The array substrate according to claim 1, wherein the array substrate further comprises a plurality of gate lines, wherein at least a portion of the gate line extends in the second direction, each of at least a part of the gate lines is provided with a second hollowed-out region, and an orthogonal projection of the second common connection member onto the base overlaps an orthogonal projection of the second hollowed-out region onto the base.

17. The array substrate according to claim 1, wherein each of the touch sensor blocks comprises a plurality of touch electrodes that are electrically connected to each other and spaced apart from each other, and the array substrate further comprises:

a plurality of gate lines, wherein at least a portion of the gate line extends in the second direction; and a plurality of third common connection members, wherein at least one of the third common connection members is arranged between the touch sensor blocks adjacent to each other in the first direction, at least a portion of the third common connection member extends in the first direction, a first end of the third common connection member is coupled to the touch electrodes in a first touch sensor block of adjacent touch sensor blocks, a second end of the third common connection member is not coupled to a second touch sensor block of the adjacent touch sensor blocks, an orthogonal portion of at least a portion of the third common connection member onto the base overlaps an orthogonal projection of the gate line onto the base at a second overlapping region;

an orthogonal projection of at least a portion of the second common connection member onto the base overlaps the orthogonal projection of the gate line onto the base at a third overlapping region, and a width of the second overlapping region is equal to a width of the third overlapping region in the first direction.

18. The array substrate according to claim 17, wherein each of at least a part of the gate lines is provided with a third hollowed-out region, and an orthogonal projection of the third common connection member onto the base at least partially overlaps an orthogonal projection of the third hollowed-out region onto the base.

19. The array substrate according to claim 17, wherein an orthogonal projection of the second end of the third common connection member onto the base does not overlap the orthogonal projection of the gate line onto the base; or the orthogonal projection of the second end of the third common connection member onto the base does not overlap an orthogonal projection of the first common connection member comprised in a second one of the adjacent touch sensor blocks onto the base.

20. A touch display device, comprising the array substrate according to claim 1.

\* \* \* \* \*